(12) United States Patent
Sato

(10) Patent No.: US 9,117,932 B2
(45) Date of Patent: Aug. 25, 2015

(54) SEMICONDUCTOR PRESSURE SENSOR AND FABRICATION METHOD THEREOF

(71) Applicant: MITSUBISHI ELECTRIC CORPORATION, Tokyo (JP)

(72) Inventor: Kimitoshi Sato, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 32 days.

(21) Appl. No.: 14/027,037

(22) Filed: Sep. 13, 2013

(65) Prior Publication Data

US 2014/0159122 A1    Jun. 12, 2014

(30) Foreign Application Priority Data

Dec. 7, 2012    (JP) .................. 2012-268539

(51) Int. Cl.
   *G01L 9/00* (2006.01)
   *H01L 21/00* (2006.01)
   *H01L 29/84* (2006.01)
   *H01L 27/06* (2006.01)

(52) U.S. Cl.
   CPC .............. *H01L 29/84* (2013.01); *G01L 9/0073* (2013.01); *H01L 27/0617* (2013.01)

(58) Field of Classification Search
   CPC ........................................ H01L 29/84
   USPC .............. 257/108, 254, 415–419; 438/50–53
   See application file for complete search history.

(56) References Cited

U.S. PATENT DOCUMENTS

| | | | | |
|---|---|---|---|---|
| 5,789,297 | A * | 8/1998 | Wang et al. ............. | 438/267 |
| 6,472,243 | B2 * | 10/2002 | Gogoi et al. .............. | 438/50 |
| 7,429,495 | B2 * | 9/2008 | Wan ....................... | 438/53 |
| 2002/0072144 | A1 | 6/2002 | Gogoi et al. | |
| 2010/0327883 | A1 * | 12/2010 | Reinmuth ................. | 324/681 |
| 2012/0205653 | A1 * | 8/2012 | Nishikage et al. ........ | 257/49 |

FOREIGN PATENT DOCUMENTS

JP    2004-526299 A    8/2004

* cited by examiner

*Primary Examiner* — Calvin Lee
(74) *Attorney, Agent, or Firm* — Studebaker & Brackett PC

(57) ABSTRACT

At a pressure sensor region, a pressure sensor including a fixed electrode, a void and a movable electrode is formed. At a CMOS region, a memory cell transistor and a field effect transistor are formed. An etching hole communicating with the void is closed by a first sealing film. The void is formed by removing a region of a film identical to the film of a gate electrode of the memory cell transistor. The movable electrode is formed of a film identical to the film of a gate electrode.

12 Claims, 35 Drawing Sheets

FIG.24
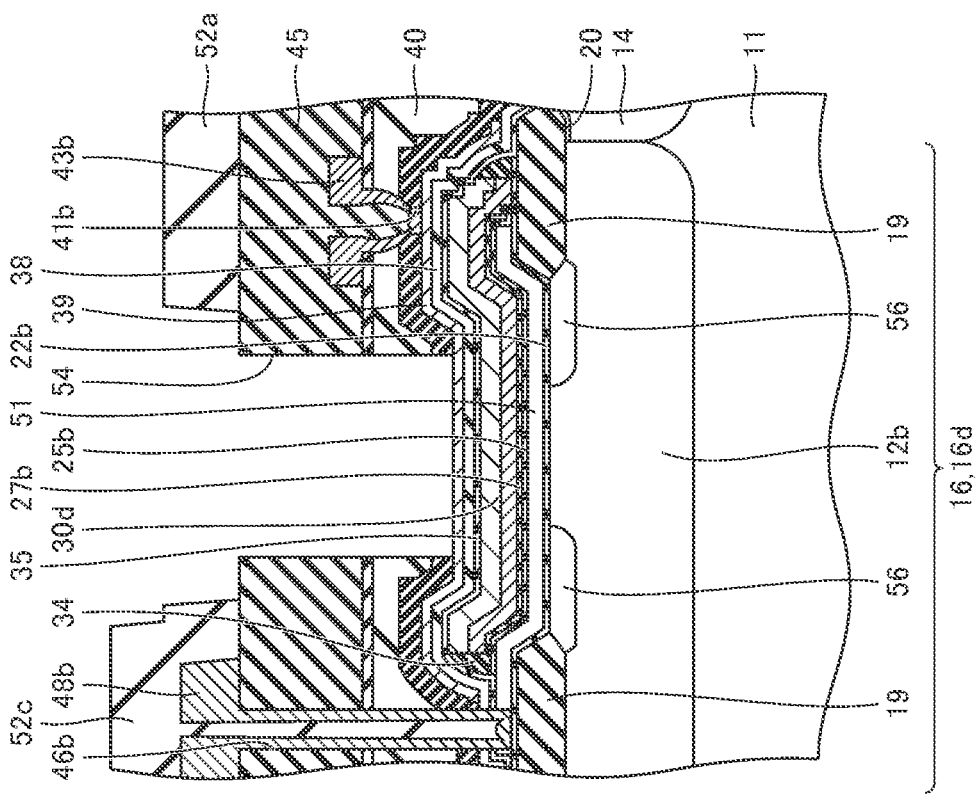
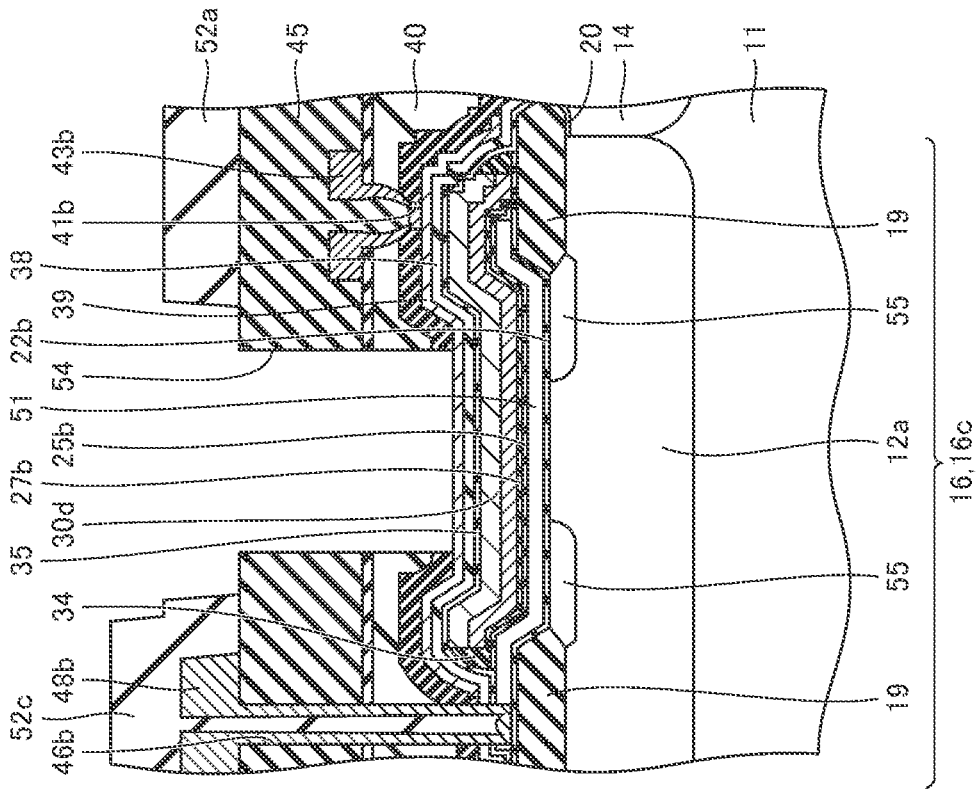

SEMICONDUCTOR PRESSURE SENSOR AND FABRICATION METHOD THEREOF

BACKGROUND OF THE INVENTION

1. Field of the Invention

The present invention relates to a semiconductor pressure sensor and a fabrication method thereof, particularly a semiconductor pressure sensor including a CMOS circuit, and a method of fabricating such a semiconductor pressure sensor.

2. Description of the Background Art

In recent years, semiconductor pressure sensors are used in various fields such as in vehicles. One known type of a semiconductor pressure sensor is integrated with a complementary metal oxide semiconductor (CMOS) circuit. A semiconductor pressure sensor disclosed in PTD 1 (Japanese National Patent Publication No. 2004-526299 (Japanese Patent No. 4267322)) will be described as such type of a semiconductor pressure sensor.

The semiconductor pressure sensor has a region where a CMOS circuit is formed (CMOS region) and a region where a pressure sensor is formed (pressure sensor region), defined at a semiconductor substrate. At the CMOS region, an n-channel type MOS transistor and a p-channel type MOS transistor constituting a CMOS circuit are formed. At the pressure sensor region, a capacitive type pressure sensor is formed. The capacitive type pressure sensor includes a fixed electrode and a movable electrode, and has a vacuum chamber provided between the fixed electrode and the movable electrode. The vacuum chamber is sealed by a sealing film. The pressure is measured by detecting the change in the distance between the movable electrode and fixed electrode as a function of the capacitance value.

A conventional semiconductor pressure sensor has a problem set forth below. For the semiconductor pressure sensor, the step of forming a pressure sensor and the step of forming a CMOS circuit are provided separately. In other words, the step of forming a sacrifice film to provide a vacuum chamber, the step of forming a movable electrode, and the step of forming a sealing film sealing the vacuum chamber are additionally required as steps dedicated to producing a pressure sensor.

When the sacrifice film is to be removed by etching, a protection film for protecting the CMOS region must be provided before that step, and the protection film must be removed after removal of the sacrifice film. Furthermore, in view of the vacuum chamber arranged below the movable electrode being formed prior to the completion of the CMOS region process, sticking countermeasures are required to prevent the movable electrode from sticking caused by a wetting process or the like. This induces the problem that the fabrication process is lengthened and rendered complicated for a conventional semiconductor pressure sensor.

SUMMARY OF THE INVENTION

In view of the foregoing, an object of the present invention is to provide a semiconductor pressure sensor that can be fabricated readily. Another object of the present invention is to provide a method of fabricating a semiconductor pressure sensor intended to reduce the number of additional fabrication steps.

A semiconductor pressure sensor according to the present invention includes first, second and third regions, a pressure sensor, a memory cell transistor, a field effect transistor, an interlayer insulation film, a hole, a sealing portion, and an opening. The first, second and third regions are defined at a surface of the semiconductor substrate by an element isolation insulation film. The pressure sensor is formed at the first region, and includes a fixed electrode, a void, and a movable electrode. The void is located above the fixed electrode and the movable electrode is located above the void. The memory cell transistor is formed at the second region, and includes a first electrode and a second electrode located above the first electrode, as the gate electrode. The field effect transistor is formed at the third region, and includes a third electrode as another gate electrode. The interlayer insulation film is formed so as to cover the pressure sensor, memory cell transistor, and field effect transistor. The hole is formed in the interlayer insulation film, communicating with the void. The sealing portion seals the void. The opening is formed at the interlayer insulation film, open towards the pressure sensor. The void is formed by removing a portion from a film identical to a conductor film qualified as the first electrode. The movable electrode is formed of a film identical to another conductor film qualified as the second electrode and third electrode.

A method of fabricating a semiconductor pressure sensor according to the present invention includes the following steps. By forming an element isolation insulation film, a first region where an pressure sensor is to be formed, a second region where a memory cell transistor is to be formed, and a third region where a field effect transistor is to be formed are defined at a surface of a semiconductor substrate. A fixed electrode is formed at the first region. A first conductor film is formed so as to cover the fixed electrode. By establishing a pattern on the first conductor film, a first conductor film pattern corresponding to a void is formed at the first region, and a first electrode qualified as a gate electrode of the memory cell transistor is formed at the second region. A second conductor film is formed so as to cover the first conductor film pattern corresponding to a void and the first electrode. By establishing a pattern on the second conductor film, a movable electrode is formed on the first conductor film pattern corresponding to a void at the first region, a second electrode is formed on the first electrode at the second region, and a third electrode qualified as a gate electrode of the field effect transistor is formed at the third region. An interlayer insulation film is formed so as to cover the movable electrode, the first electrode, the second electrode, and the third electrode. A hole reaching the first conductor film pattern corresponding to a void is formed at a region of the interlayer insulation film located at the first region. A void is formed by removing the first conductor film pattern corresponding to the void. The hole communicating with the void is closed. At the region of the interlayer insulation film located at the first region, an opening is formed toward the movable electrode.

A semiconductor pressure sensor of the present invention can be readily fabricated in a manner having a semiconductor device formed at the second region and third region, and a pressure sensor formed at the first region.

According to a method of fabricating a semiconductor pressure sensor of the present invention, a pressure sensor can be fabricated readily at the first region, complying with the fabrication steps of a semiconductor device and the like formed at the second and third regions.

The aforementioned and other objects, features, aspects and advantages of the present invention will become apparent from the detailed description set forth below related to the present invention understood in association with the attached drawings.

BRIEF DESCRIPTION OF THE DRAWINGS

FIGS. 23 and 24 are partial sectional views representing a step performed after the step of a preceding drawing in the fourth embodiment.

DESCRIPTION OF THE PREFERRED
EMBODIMENTS

First Embodiment

A semiconductor pressure sensor and a fabrication method thereof according to a first embodiment will be described hereinafter starting from the fabrication method.

Figure 1:
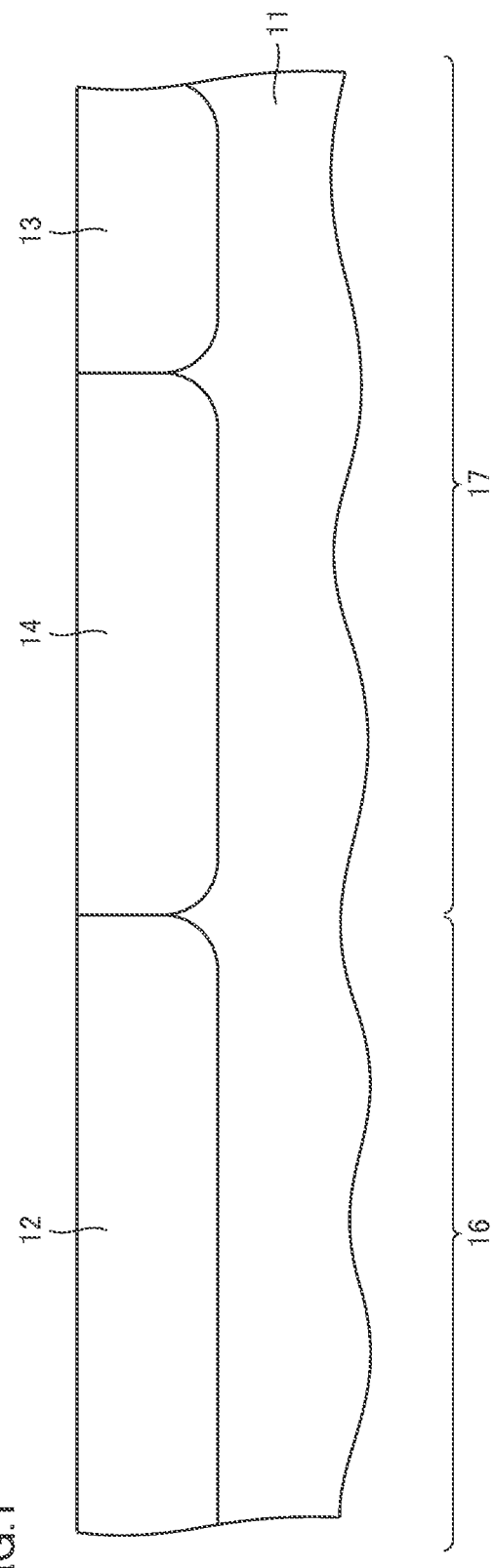
FIG. 1 is a sectional view representing a step in a fabrication method of a semiconductor pressure sensor according to a first embodiment of the present invention.

As shown in FIG. 1, the formation step starts by forming well regions 12, 13 and 14, each of a predetermined conductivity type, at a pressure sensor region 16 where a pressure sensor is to be formed and a CMOS region 17 where a CMOS circuit is to be formed. In the formation step thereof, a p type silicon substrate, for example, is prepared. Then, a silicon oxide film and a silicon nitride film are sequentially formed so as to cover the silicon substrate. Next, a resist mask is formed, directed to removing the silicon nitride film located at the region where an NMOS transistor is to be formed in the CMOS region.

By applying an etching process with that resist mask as an etching mask, the silicon nitride film is removed. Subsequently, using the resist mask that was employed as an etching mask now as an implantation mask, p type impurities (for example, boron) directed to forming a third well region 14 (refer to FIG. 1) are implanted. Then, the resist mask is removed.

By applying thermal oxidation, a silicon oxide film is formed at the region where the silicon nitride film was removed. Accordingly, a relatively thick silicon oxide film is formed at the surface of third well region 14, followed by removal of the silicon nitride film. Then, using the relatively thick silicon oxide film as an implantation mask, n type impurities (for example, phosphorus) directed to forming a first well region 12 at the pressure sensor region (refer to FIG. 1) and a second well region 13 at the CMOS region (refer to FIG. 1) are implanted.

Then, by applying annealing under a predetermined condition, the implanted p type impurities and n type impurities are activated to diffuse. Subsequently, the silicon oxide film remaining at the surface of the silicon substrate is removed. Thus, a first well region 12 of the n type is formed at pressure sensor region 16, as shown in FIG. 1. At CMOS region 17, a second well region 13 of the n type and a third well region 14 of the p type are formed.

Figure 2:
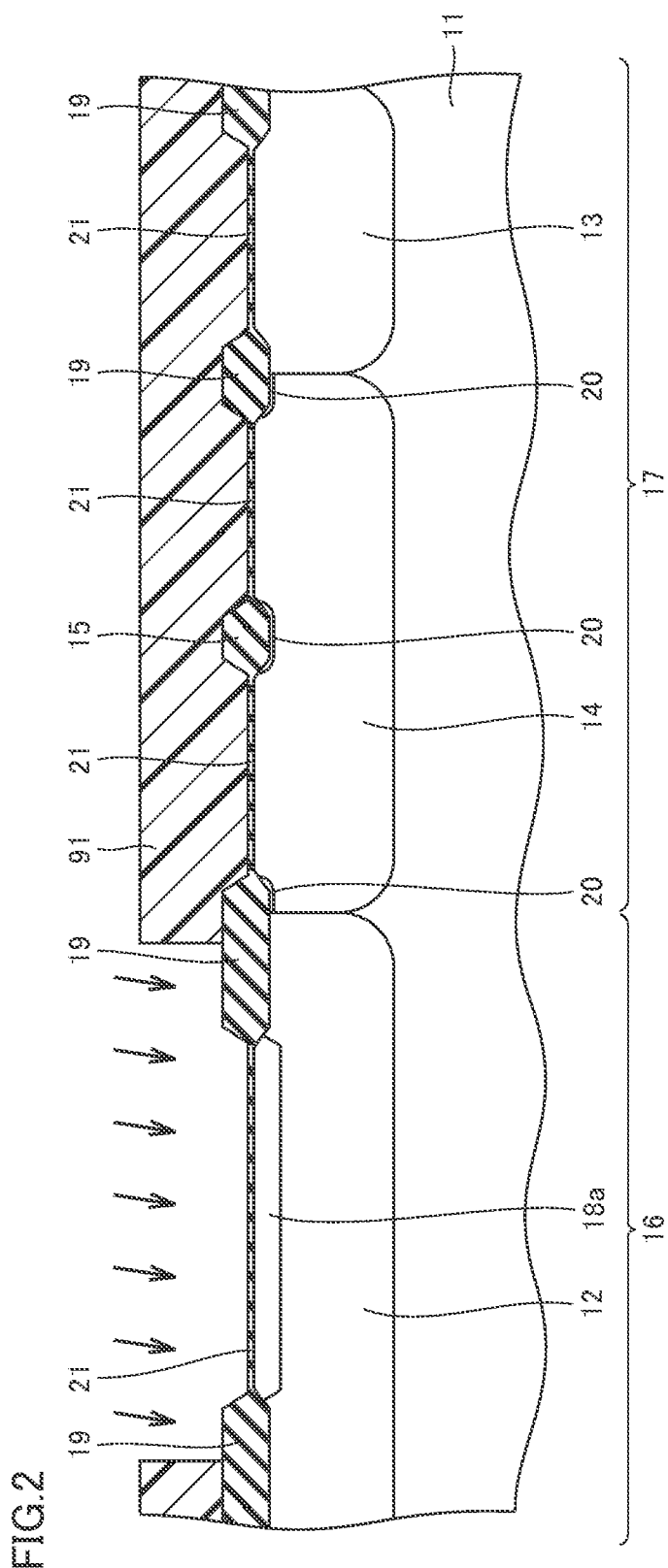
FIGS. 2-13 are sectional views representing a step performed after the step of a preceding drawing in the first embodiment.

The process proceeds to the step of forming field oxide films 15 and 19 shown in FIG. 2 by means of local oxidation of silicon (LOCOS), for example. At the surface of the silicon substrate, an underlying oxide film, a polysilicon film, and a silicon nitride film (all not shown) are sequentially formed. Then, by applying predetermined photolithography, a resist mask (not shown) directed to forming a field oxide film is provided. By applying an etching process using the resist mask as an etching mask, the silicon nitride film corresponding to the region where the field oxide film is formed is removed. Then, the resist mask is removed. Subsequently, by applying photolithography again, a resist mask (not shown) directed to forming a channel stopper is provided. Using this resist mask as an implantation mask, p type impurities (for example, boron) are implanted to the region corresponding to a channel stopper. Then, the resist mask is removed.

Next, by applying oxidation under a predetermined condition, the area where the silicon nitride film is removed is locally oxidized to form field oxide films 15 and 19 (refer to FIG. 2). At this stage, the implanted p type impurities are activated to form a channel stopper 20 (refer to FIG. 2). Then, the remaining silicon nitride film is removed.

Thus, as shown in FIG. 2, field oxide film 19 is formed at pressure sensor region 16 whereas field oxide films 15 and 19 are formed at CMOS region 17. Field oxide films 15 and 19 have a film thickness of approximately 0.2 to 1.0 μm. Underlying oxide film 21 is located at the surface of first well region 12, second well region 13 and third well region 14. A semiconductor device such as an MOS transistor formed in the region defined by field oxide films 15 and 19 is electrically insulated from field oxide films 15 and 19 by a channel stopper 20 formed right under thereof.

By applying photolithography, a resist mask 91 directed to forming a fixed electrode is provided at pressure sensor region 16. By implanting n type impurities (for example, phosphorus) using resist mask 91 as an implantation mask, a fixed electrode 18a is formed at pressure sensor region 16. FIG. 2 corresponds to the step of this stage. Then, resist mask 91 and underlying oxide film 21 are removed. It is to be noted that formation of fixed electrode 18a that is a dedicated step of forming a pressure sensor does not have to be performed, and first well region 12 may be taken as a fixed electrode. Accordingly, an additional fabrication step can be avoided.

Figure 3:
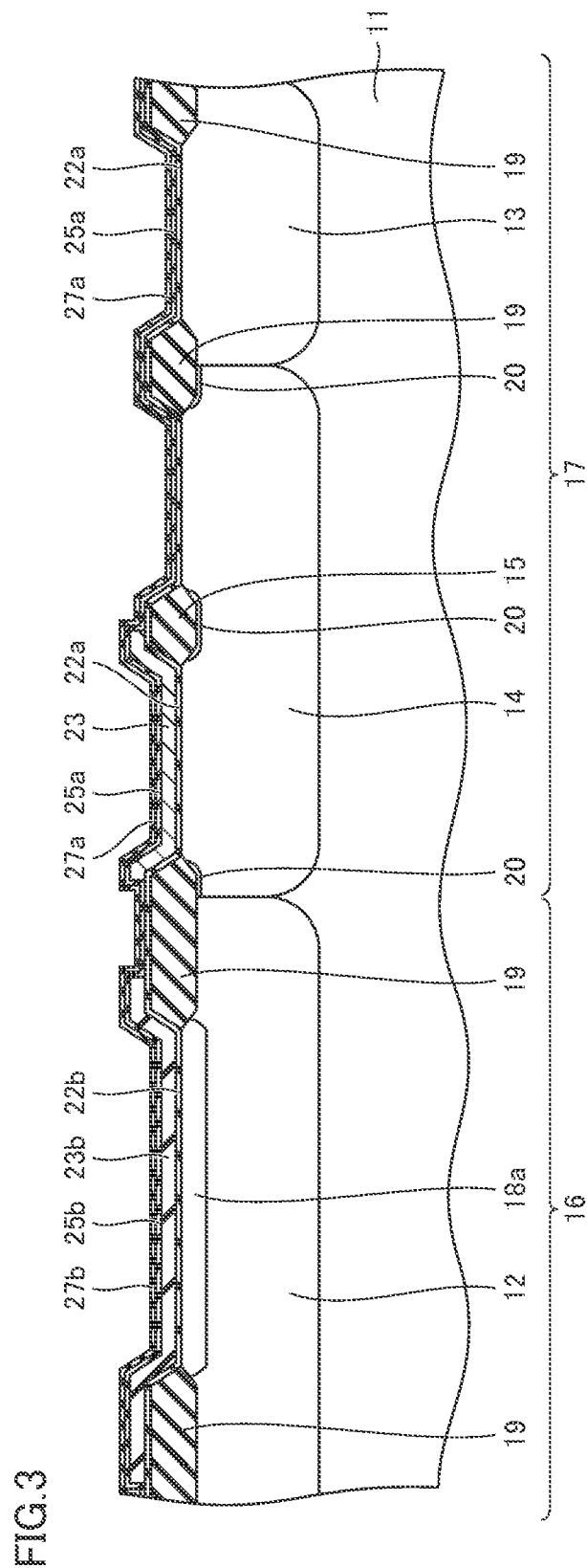

The process proceeds to the step shown in FIG. 3 where there are formed a sacrifice film 23b at pressure sensor region 16 and a polysilicon film 23 qualified as a floating gate electrode of an EPROM (Erasable Programmable Read Only Memory) at CMOS region 17, made of the same material. First, the silicon substrate having the underlying oxide film removed is subjected to thermal oxidization. A first gate oxide film 22a (film thickness approximately 5-30 nm) is formed at the surface of exposed silicon substrate 11 at CMOS region 17 while a fixed electrode protection film 22b made of the same film as the film qualified as the first gate oxide film is formed at the surface of exposed silicon substrate 11 at pressure sensor region 16 simultaneously. In other words, fixed electrode protection film 22b functions as a protection film for fixed electrode 18a when the sacrifice film is to be removed by etching, as will be described afterwards, whereas first gate oxide film 22a functions as a gate oxide film of an EPROM formed at CMOS region 17.

By chemical vapor deposition (CVD), a polysilicon film (not shown) is formed so as to cover first gate oxide film 22a and fixed electrode protection film 22b. At this stage, phosphorus is introduced by the well-known method during or immediately after formation of the polysilicon film to achieve the conductance as an n type polysilicon film. Then, photolithography is applied to form a resist mask directed to establishing a pattern of a sacrifice film and a floating gate. By applying a predetermined etching process using the resist mask as an etching mask, sacrifice film 23b corresponding to the patterned polysilicon film is provided at pressure sensor region 16. A vacuum chamber will be formed by removing this sacrifice film 23b, as will be described afterwards. On the part of CMOS region 17, a pattern (film thickness approximately 50-300 nm) is established on polysilicon film 23 qualified as the floating gate electrode of an EPROM. Subsequently, the resist mask is removed.

Then, by thermal oxidization, for example, a second gate oxide film 25a (film thickness approximately 5-30 nm) is formed so as to cover polysilicon film 23 at CMOS region 17 while a first movable electrode protection film 25b made of the same film as the film qualified as the second gate oxide film is formed so as to cover sacrifice film 23b at pressure sensor region 16 simultaneously. By CVD, a first silicon nitride film 27a (film thickness approximately 5-30 nm) is deposited so as to cover second gate oxide film 25a at CMOS region 17 while a second movable electrode protection film 27b made of the same film as the film qualified as the first silicon nitride film is deposited at pressure sensor region 16 simultaneously. First movable electrode protection film 25b and second movable electrode protection film 27b function as a protection film of the movable electrode during removable of the sacrifice film through etching. The movable electrode will be described afterwards.

Thus, fixed electrode protection film 22b protecting fixed electrode 18a is deposited at the same time in the step of forming first gate oxide film 22a. Sacrifice film 23b qualified as a vacuum chamber is formed at the same time in the step of forming a polysilicon film qualified as the floating gate electrode of an EPROM. First movable electrode protection film 25b protecting the movable electrode is formed at the same time in the step of forming second gate oxide film 25a. Furthermore, a second movable electrode protection film 27b protecting a movable electrode is formed at the same time in the step of forming first silicon nitride film 27a. Therefore, the relationship shown here implies that a dedicated step of forming a pressure sensor is not required.

Then, a resist mask (not shown) is formed, exposing second well region 13 where a p-channel MOS transistor is to be formed and covering the remaining region. Using this resist mask as an implantation mask, predetermined impurities (for example, phosphorus and boron difluoride ($BF_2$)) directed to controlling the threshold voltage of a p type MOS transistor are implanted. Subsequently, the resist mask is removed. Also, a resist mask (not shown) is formed, exposing third well region 14 where an n-channel MOS transistor is to be formed, and covering the remaining region. Using this resist mask as an implantation mask, prescribed impurities (for example, boron) directed to controlling the threshold voltage of an n type MOS transistor are implanted. Subsequently, the resist mask is removed.

Then, a resist mask (not shown) is formed, exposing the region where a p-channel MOS transistor is to be formed at second well region 13 as well as the region where the n-channel MOS transistor is to be formed at third well region 14 in CMOS region 17, and covering the remaining region. Using this resist mask as an etching mask, an etching process is applied to remove a region of first gate oxide film 22a, a region of second gate oxide film 25a, and a region of first silicon nitride film 27a to expose a surface of silicon substrate 11. Subsequently, the resist mask is removed.

Figure 4:
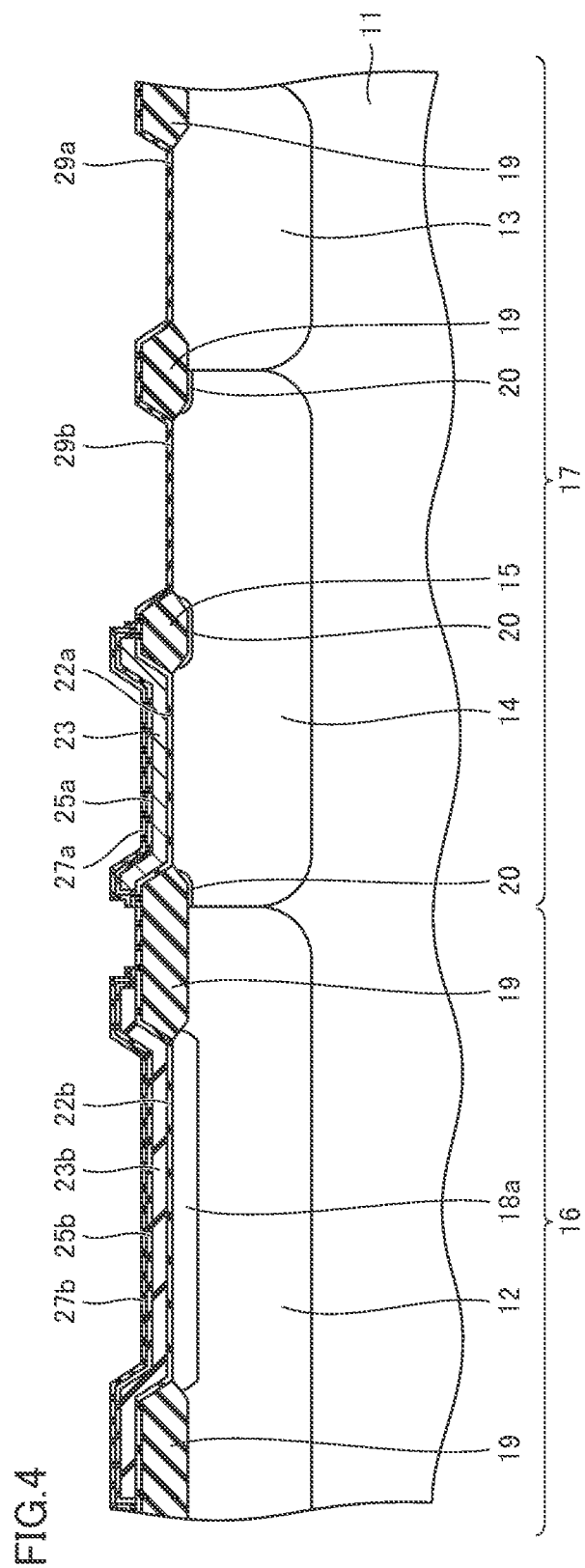

By thermal oxidization, a third gate oxide film 29b (film thickness approximately 5-30 nm) is formed at the surface of the region where a p-channel MOS transistor is to be formed at second well region 13, and a third gate oxide film 29a (film thickness approximately 5-30 nm) is formed at the surface of the region where an n-channel MOS transistor is to be formed at third well region 14, as shown in FIG. 4.

Figure 5:
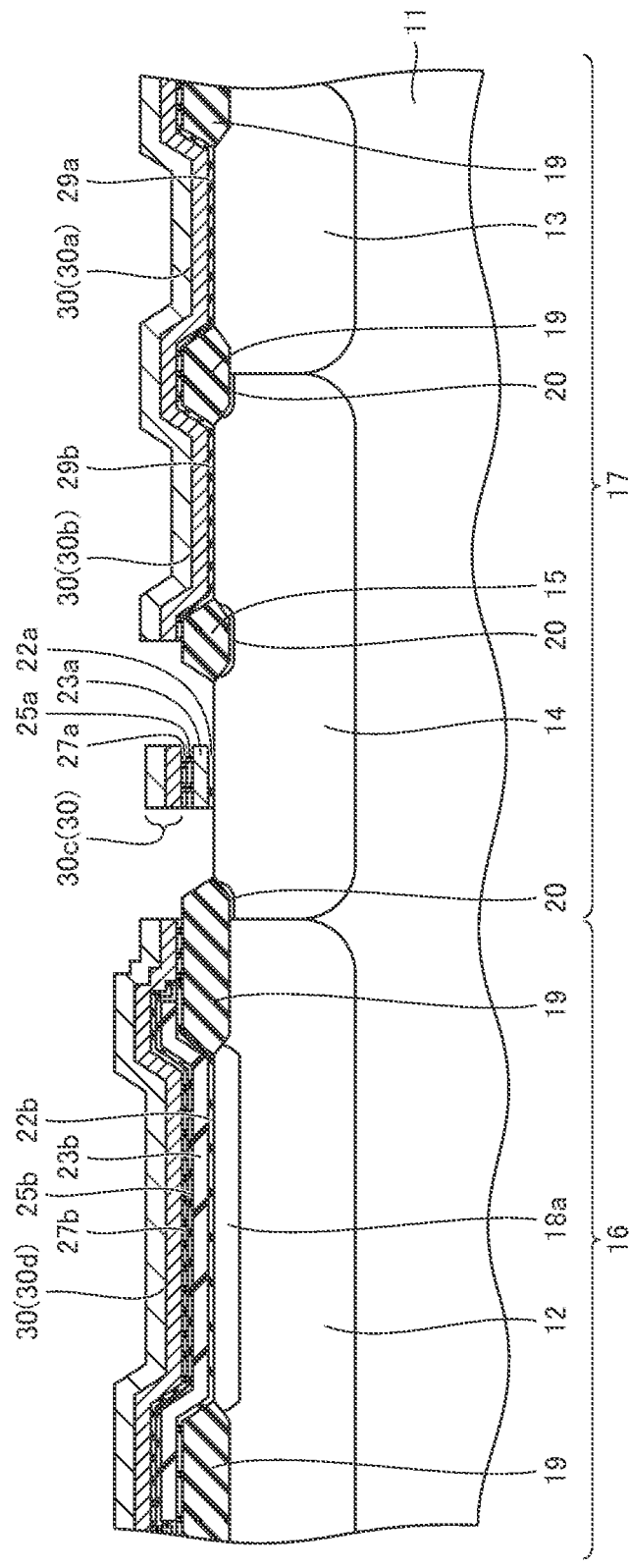

Then, the process proceeds to the step shown in FIG. 5 where there are to be formed a conductor film 30 qualified as a movable electrode 30d at pressure sensor region 16, a conductor film 30 qualified as gate electrodes 30a and 30b of p- and n-channel MOS transistors at CMOS region 17, and a gate electrode 30b of an EPROM, made of the same material. First, a prescribed conductor film 30 (refer to FIG. 5) is formed so as to cover first silicon nitride film 27a, second movable electrode protection film 27b and third gate oxide films 29a and 29b. A stacked film of a two-layered structure including a polysilicon film (film thickness approximately 50-300 nm) and a tungsten silicide ($WSi_2$) film (film thickness approximately 50-300 nm), i.e. a polycide film, constitutes conductor film 30. The polysilicon film is formed by CVD, and set as an n type polysilicon film by having phosphorus introduced during or immediately after formation of the polysilicon film. The tungsten silicide film is formed by sputtering or CVD so as to cover the polysilicon film.

Then, a resist mask (not shown) directed to establishing a pattern of a gate electrode of an EPROM is formed. By etching using the resist mask as an etching mask, there is given a pattern of a gate electrode of an EPROM. At the EPROM (memory cell transistor) formation region in CMOS region 17 shown in FIG. 5, conductor film 30, first silicon nitride film 27a, second gate oxide film 25a, the pattern on polysilicon film 23 and first gate oxide film 22a are etched to form the gate electrodes of an EPROM including a floating gate electrode 23a and a gate electrode 30c. Following removal of the resist mask, n type impurities (for example, arsenic) are implanted using the gate electrodes as an implantation mask to form a first source/drain region 33. First source/drain region 33 corresponds to the EPROM shown in FIG. 6.

As will be described afterwards, a movable electrode qualified as a diaphragm will be formed by conductor film 30 at pressure sensor region 16. At CMOS region 17, a gate electrode of a p-channel MOS transistor and a gate electrode of an n-channel MOS transistor will be formed by conductor film 30. As the conductor film, a stacked film of a polysilicon film and a titanium silicide ($TiSi_2$) film, for example, may be employed other than the stacked film of a polysilicon film and tungsten silicide film.

Figure 6:
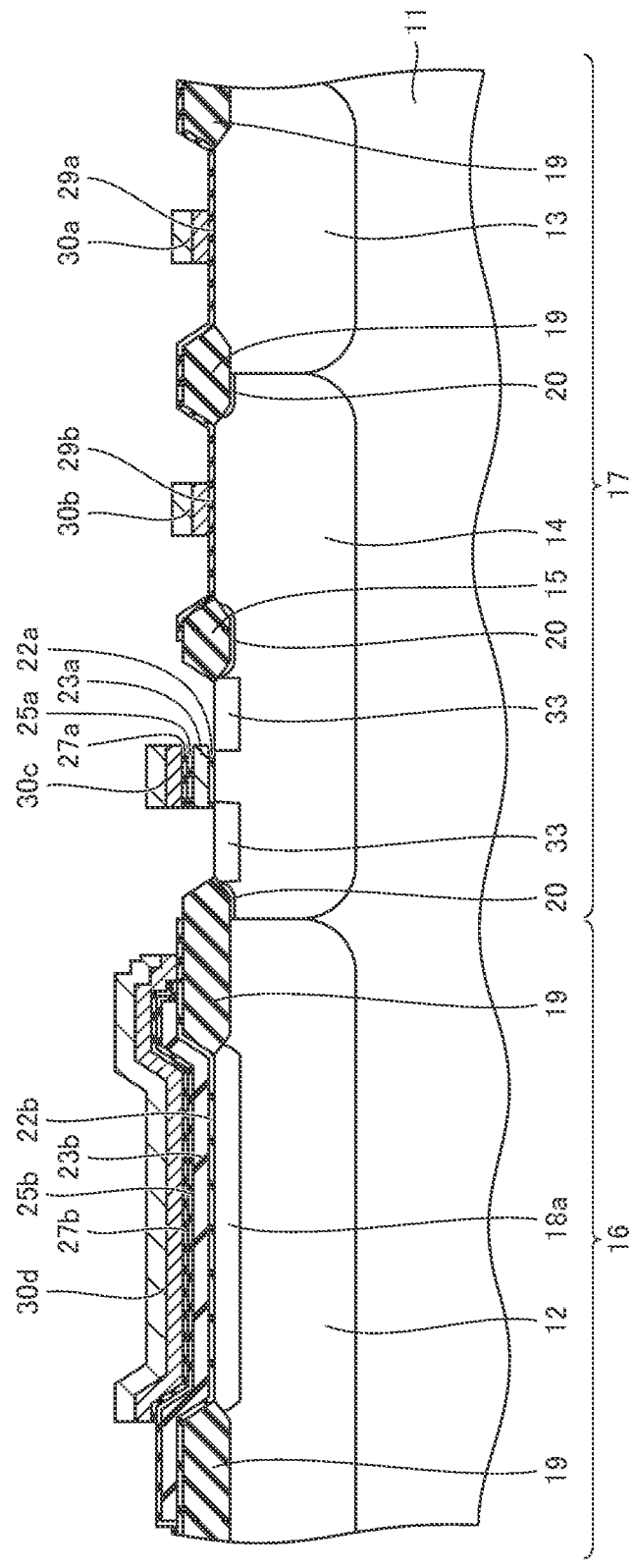

A resist mask (not shown) directed to establishing a pattern of the gate electrode of a p-channel MOS transistor, the gate electrode of an n-channel MOS transistor, and the movable electrode is formed. By etching conductor film 30 using the resist mask as an etching mask, a gate electrode 30b of an n-channel MOS transistor and a gate electrode 30a of a p-channel MOS transistor are formed at CMOS region 17, as shown in FIG. 6. At pressure sensor region 16, a movable electrode 30d qualified as a diaphragm is formed. Following removal of the resist mask, thermal treatment is applied under a predetermined condition to activate first source/drain region 33.

Thus, movable electrode 30d is formed at the same time in the step of forming conductor film 30 corresponding to gate electrodes 30a, 30b and 30c, and the step of forming gate electrodes 30a, 30b and 30c by etching the provided conductor film.

Figure 7:
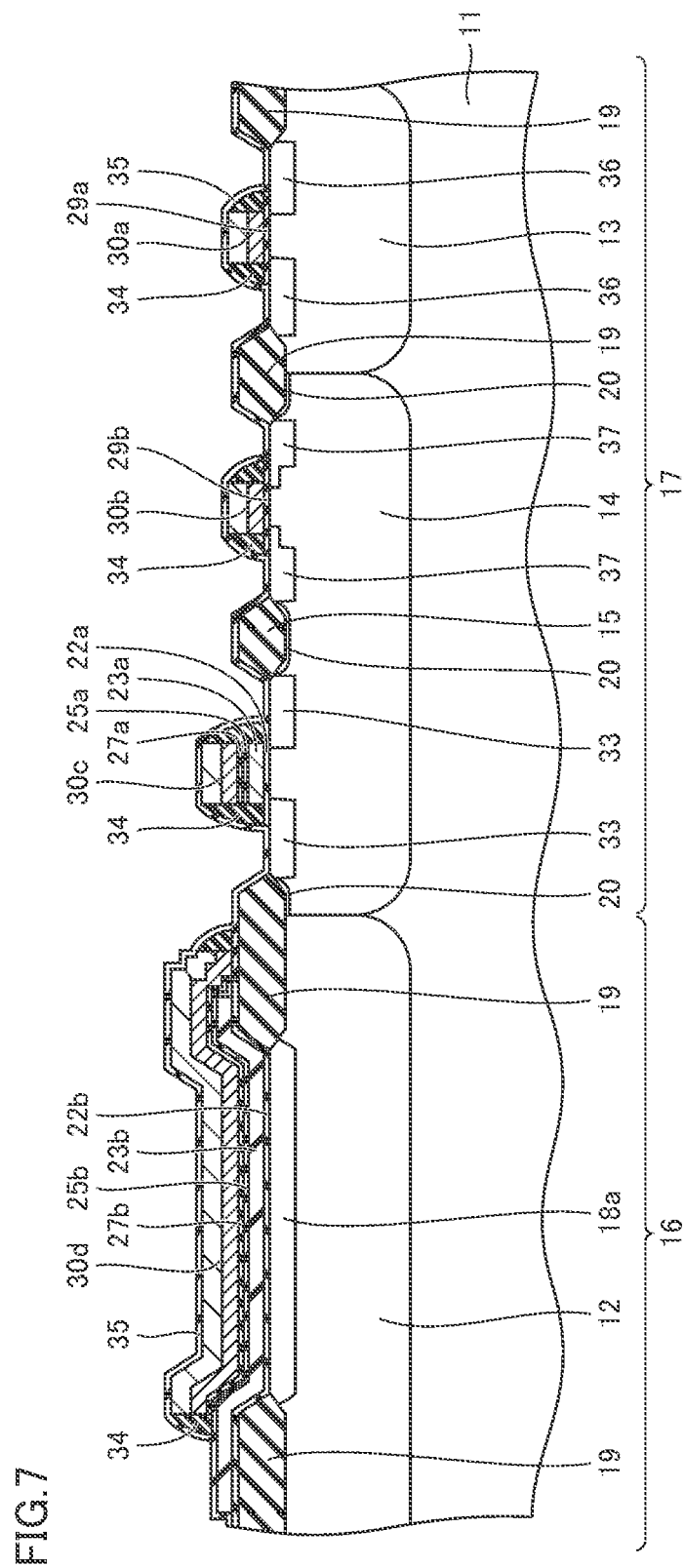

Then, a resist mask (not shown) is formed, exposing only the region where an n-channel MOS transistor is located, and covering the remaining region. By implanting n type impurities (for example, phosphorus) using the resist mask and gate electrode 30b as an implantation mask, an LDD region (refer to FIG. 7) is provided, followed by removal of the resist mask. Then, a TEOS (Tetra Ethyl Ortho Silicate glass) film (not shown), for example, is formed so as to cover gate electrodes 30a, 30b and 30c and movable electrode 30d. By applying anisotropic dry etching to the entire surface of the TEOS film, a sidewall oxide film 34 is formed at each sidewall face of gate electrodes 30a, 30b and 30c and movable electrode 30d, as shown in FIG. 7. Formation of sidewall oxide film 34 also at the sidewall face of movable electrode 30d particularly serves to reduce the stepped portion around movable electrode 30d.

Then, a resist mask (not shown) is formed at third well region 14, exposing the region where an n-channel MOS transistor is located, and covering the remaining region. By implanting n type impurities (for example, arsenic) using that resist mask and gate electrode 30b as an implantation mask, a second source/drain region 37 is provided, followed by removal of that resist mask. Then, at second well region 13, a resist mask (not shown) is formed, exposing the region where a p-channel MOS transistor is formed, and covering the remaining region. By implanting p type impurities (for example, boron difluoride) using that resist mask and gate electrode 30a as an implantation mask, a third source/drain region 36 is formed.

Following removal of that resist mask, annealing is applied under a predetermined condition to activate second source/drain region 37 and third source/drain region 36. By CVD, for example, silicon oxide film 35 is formed so as to cover gate electrodes 30a, 30b and 30c and movable electrode 30d. FIG. 7 corresponds to the step of this stage.

Figure 8:
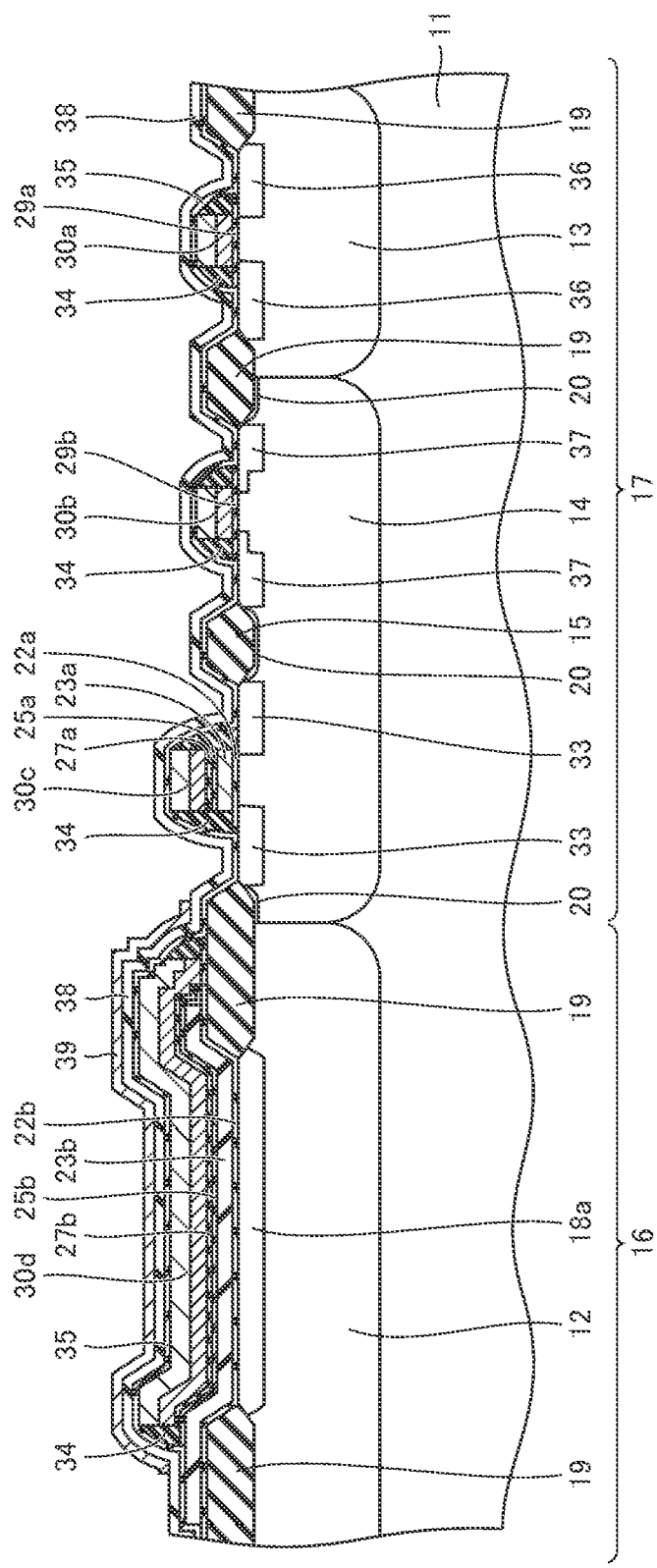

As shown in FIG. 8, a TEOS-based oxide film 38 is formed so as to cover silicon oxide film 35. A conductive polysilicon film (not shown) qualified as a shield film is formed so as to cover oxide film 38. Then, photolithography is applied to form a resist mask (not shown) covering movable electrode 30d and exposing the remaining region. By applying an etching process using that resist mask as an etching mask, the exposed polysilicon film is removed to form a shield film 39 covering movable electrode 30d, as shown in FIG. 8. Then, the resist mask is removed. The lessening of the stepped portion around movable electrode 30d by virtue of sidewall oxide film 34 at this stage allows discontinuation of shield film 39 caused by a crack or insufficient coverage to be prevented and improve the degree of freedom in setting the film thickness of shield film 39.

At pressure sensor region 16, the sum of the film thickness of each first movable electrode protection film 25b, second movable electrode protection film 27b, movable electrode 30d, oxide films 35, 38 and shield film 39 is relevant to the film thickness of the diaphragm in the pressure sensor. The sensitivity property relative to the pressure is determined by this thickness.

First movable electrode protection film 25b, second movable electrode protection film 27b and movable electrode 30d at pressure sensor region 16 are formed at the same time as the step of forming second gate oxide film 25a, first silicon nitride film 27a and gate electrodes 30a, 30b and 30c at CMOS region 17. Furthermore, the thermal treatment condition is the same as the condition employed for the MOS transistor and the like formed at CMOS region 17. Accordingly, while a significant modification may be restricted, the pressure sensor can be modified, complying with the specification of a semiconductor device such as a MOS transistor formed at the CMOS region.

Further, by adjusting the film thickness of each shield film 39 and oxide film 38, the sensitivity property with respect to the initial capacitance value of movable electrode 30d (the amount of deflection of the movable electrode) can be regulated. Moreover, the sensitivity property relative to a pressure can be controlled. The film thickness of shield film 39 is approximately 50-1000 nm.

The covering of shield film 39 on movable electrode 30d with oxide film 38 therebetween prevents direct contact of movable electrode 30d with the outside. In addition, connection of shield film 39 to ground potential blocks out the effect of externally applied charge and the like, allowing property variation of the pressure sensor to be suppressed. A pressure sensor of the type not requiring high accuracy may take a configuration absent of a shield film. In this case, a dedicated step in the pressure sensor region can be dispensed with.

Figure 9:
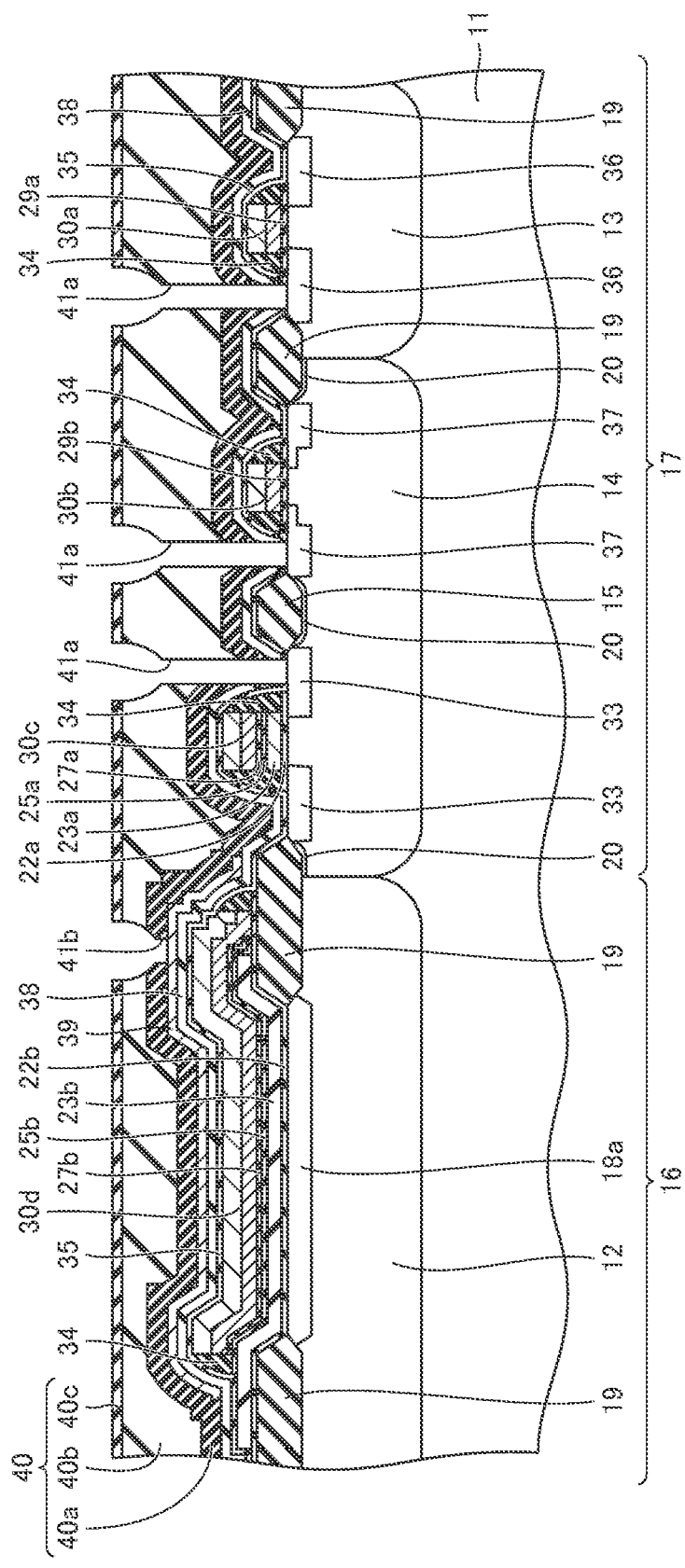

As shown in FIG. 9, a first interlayer insulation film 40 is formed so as to cover oxide film 38 and shield film 39. First interlayer insulation film 40 takes a stacked structure of a TEOS film 40a, a BPSG (Boro Phospho Silicate Glass) film 40b, and a TEOS film 40c. The first interlayer insulation film is not limited to such a stacked structure, and may employ another oxide film. Furthermore, for planarizing first interlayer insulation film 40, an etch-back process may be applied to the BPSG film. Also, chemical mechanical polishing (CMP) may be applied.

Next, a resist mask (not shown) directed to forming a contact hole is provided by photolithography. Using the resist mask as an etching mask, an etching process is applied under a condition complying with the specification of the semiconductor device to be formed at CMOS region 17. At CMOS region 17, a contact hole 41a is formed through first interlayer insulation film 40 and the like, exposing first source/drain region 33, second source/drain region 37, and third source/drain region 36. At pressure sensor region 16, a contact hole 41b exposing shield film 39 is formed, followed by removal of the resist mask. FIG. 9 corresponds to the step of this stage.

The etching process at this stage may be a combination of wet etching and dry etching to form contact holes 41a and 41b. In this case, contact holes 41a and 41b have a spread at the upper region of the opening, as shown in FIG. 9. Contact holes 41a and 41b may be formed by an etching process including only dry etching.

Figure 10:
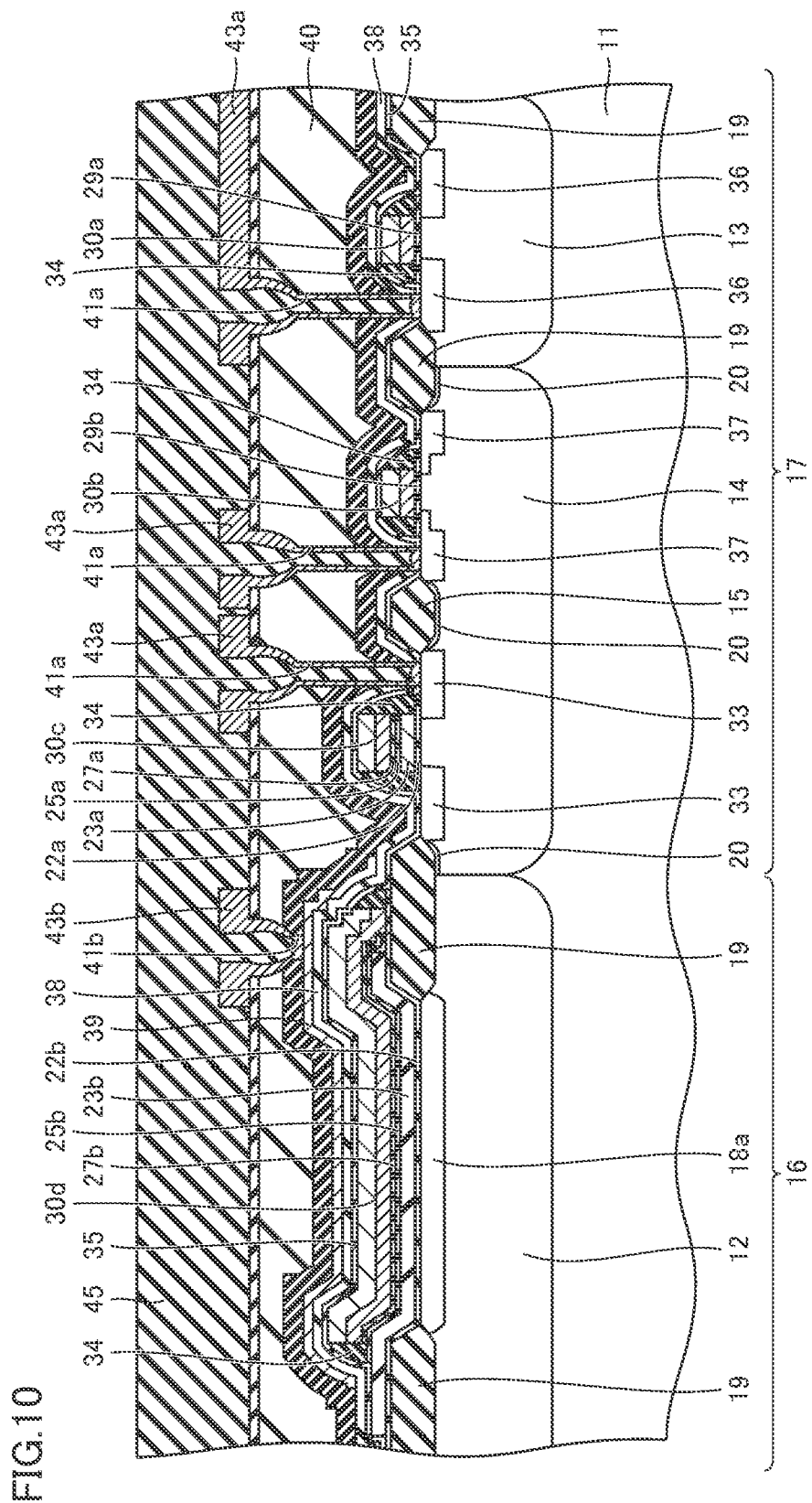

The process proceeds to the step shown in FIG. 10 where a first interconnection 43 and a second interlayer insulation film 45 covering first interconnection 43 are to be formed. First, a first interconnection and the like are formed using a metal film. A barrier metal film and an aluminium silicon copper (AlSiCu) film (both not shown) are formed so as to cover first interlayer insulation film 40. The barrier metal film includes, for example, a titanium nitride (TiN) film. By establishing a pattern on that aluminium silicon copper film and the like, a first interconnection 43*a* is formed at CMOS region 17, and an interconnection 43*b* is formed at pressure sensor region 16. Specifically, a resist mask is formed on the aluminium silicon copper film. The aluminium silicon copper film and barrier metal film are etched using the resist mask as an etching mask, followed by removal of the resist mask to form first interconnection 43*a* and interconnection 43*b*. First interconnection 43*a* is electrically connected to each first source/drain region 33, second source/drain region 37, and third source/drain region 36. Interconnection 43*b* is electrically connected to shield film 39.

As the first interconnection and the like, a tungsten plug may be formed at contact holes 41*a* and 41*b*, followed by formation and patterning on the barrier metal and aluminium copper (AlCu) film. Suitable barrier metal in the case of such a configuration includes a titanium silicide ($TiSi_2$) or cobalt silicide ($CoSi_2$) film, and the like. As shown in FIG. 10, a second interlayer insulation film 45 is formed so as to cover first interconnections 43*a* and interconnection 43*b*. Second interlayer insulation film 45 is formed under a condition complying with the specification of the semiconductor device formed at CMOS region 17. For second interlayer insulation film 45, a low temperature oxide (LTO) film or the like is suitable. For planarization, a stacked structure including an SOG (Spin on Glass) film may be employed. CMP may be applied, likewise with the first interlayer insulation film.

Figure 11:
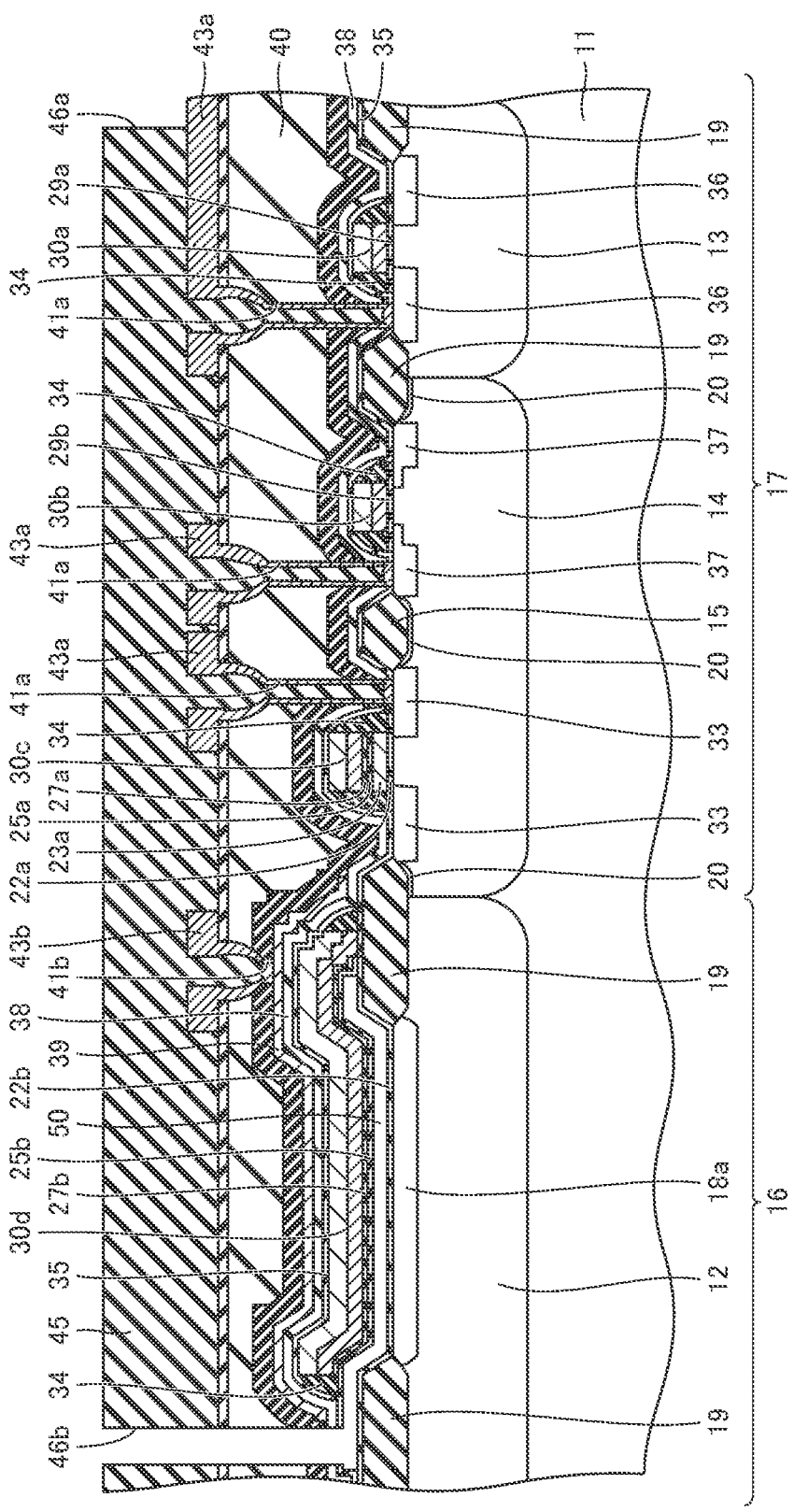

By photolithography, a resist mask (not shown) directed to forming an etching hole and contact hole is provided. By applying an etching process to the insulation film such as the second interlayer insulation film using the provided resist mask as an etching mask, an etching hole 46*b* directed to etching the sacrifice film is formed at pressure sensor region 16 while a contact hole 46*a* exposing first interconnection 43*a* is formed at CMOS region 17 simultaneously, as shown in FIG. 11. Etching hole 46*b* and contact hole 46*a* are formed under a condition complying with the specification of the semiconductor device formed at CMOS region 17. Then, the resist mask is removed.

By applying wet etching through etching hole 46*b*, sacrifice film 23*b* made of a polysilicon film is removed. FIG. 11 corresponds to the step at this stage. For the chemical agent in this wet etching process, TMAH (Tetra Methyl Ammonium Hydroxide), for example, is used. Since contact hole 46*a* is open, the TMAH used as the chemical agent must be selected so as to prevent etching of first interconnection 43*a* formed from an aluminium copper silicon film.

In the etching process using the chemical agent (TMAH), the etching rate of the polysilicon film constituting sacrifice film 23*b* is approximately 5000 to 30000 times (etching selectivity ratio approximately 5000 to 30000) the etching rate of the oxide film constituting second interlayer insulation film 45 and first interlayer insulation film 40. Therefore, the device formed at CMOS region 17 and pressure sensor region 16 can be protected by second interlayer insulation film 45 and first interlayer insulation film 40 formed under a condition complying with the specification of the semiconductor device formed at the CMOS region. As to the treatment of removing sacrifice film 23*b*, dry etching applying xenon difluoride ($XeF_2$) or the like may be employed other than wet etching.

By the simultaneous formation of etching hole 46*b* and contact hole 46*a* and the protection of the device formed at CMOS region 17 as well as pressure sensor region 16 through second interlayer insulation film 45 and first interlayer insulation film 40, the CMOS standard process is intentionally applied, contributing toward suppressing increase in the number of fabrication steps and reducing the fabrication cost.

Also, there is no need to add a step just of forming a pressure sensor. Therefore, any damage to CMOS region 17 caused by thermal treatment and damage caused by dry etching or the like can be prevented. Further, fabrication of the pressure sensor is facilitated. Moreover, degradation in the property as a semiconductor pressure sensor can be suppressed.

Although the description is based on the case where etching hole 46*b* and contact hole 46*a* are formed simultaneously, etching hole 46*b* (refer to FIG. 11) and contact hole 46*a* may be formed separately in different steps. In this case, a resist mask (not shown) directed to forming etching hole 46*b* is provided. Using that resist mask as an etching mask, a dry etching process or an etching process based on a combination of dry etching and wet etching is applied to the insulation film such as the second interlayer insulation film to form etching hole 46*b*, followed by removal of the resist mask.

Next, wet etching is performed through etching hole 46*b* using TMAH as the chemical agent to remove sacrifice film 23*b*, whereby a void 50 (refer to FIG. 11) is formed. A predetermined metal film is then provided by vapor deposition or sputtering, followed by establishing a pattern on the metal film to form a first sealing film 48*b* independently (refer to FIG. 12) that closes etching hole 46*b*, as will be described afterwards. For the metal film, a film applied in a CMOS process such as an aluminium (Al) film, aluminium silicon (Al—Si) film, aluminium silicon copper (Al—Si—Cu) film, aluminium copper (Al—Cu) film or the like is used. Here, a pretreatment step is not required before providing a metal film since the object of the aforementioned step is to close the etching hole with a metal film. The step of forming a barrier metal film is also not necessary.

Next, a resist mask (not shown) directed to forming contact hole 46*a* is provided. Using that resist mask as an etching mask, a dry etching process or an etching process based on a combination of dry etching and wet etching is applied to second interlayer insulation film 45 to form contact hole 46*a*.

The procedure of forming etching hole 46*b* and contact hole 46*a* in different steps is advantageous in that, despite the number of steps being increased, the general TMAH can be used as the chemical agent in etching sacrifice film 23*b*. Furthermore, an optimum film thickness and film type can be selected for first sealing film 48*b*, allowing the degree of freedom in designing to be increased and facilitate fabrication of a semiconductor pressure sensor.

Description will be continued returning to the former step. The process of setting void 50 formed by removing sacrifice film 23*b* qualified as a vacuum chamber is performed. First, a predetermined metal film (not shown) is formed by, for example, vapor deposition or sputtering under a condition complying with the specification of a semiconductor device to be formed at CMOS region 17. For the metal film, a stacked film including a barrier metal film such as of titanium nitride (TiN) and an aluminium silicon copper (Al—Si—Cu) film is provided. By the provision of a stacked film in vacuum at this stage, void 50 is reduced in pressure to be qualified as a vacuum chamber 51. This vacuum chamber 51 is sealed by the stacked film (first sealing film 48*b*).

Figure 12:
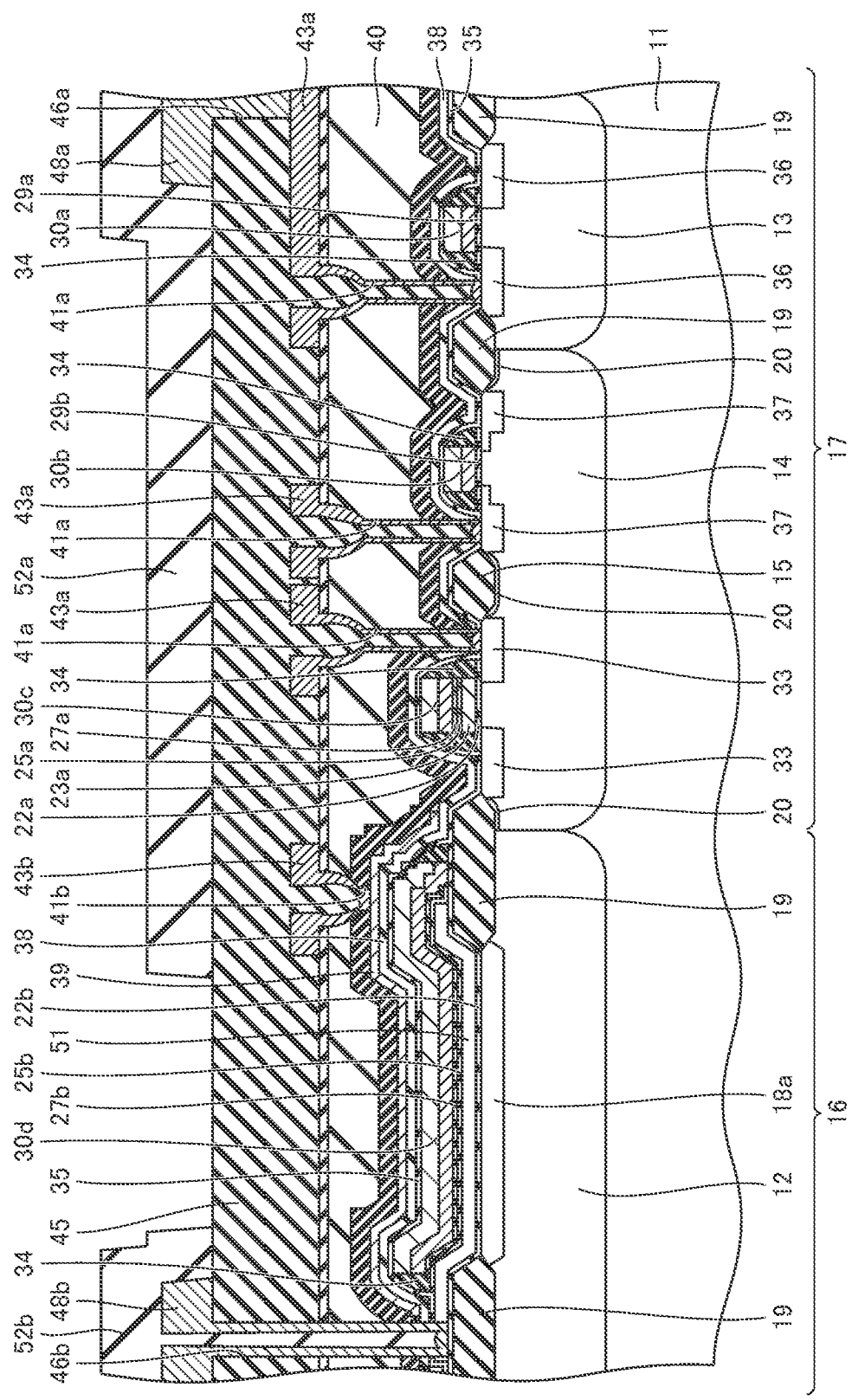

By establishing a pattern on the stacked film, first sealing film 48*b* closing etching hole 46*b* (vacuum chamber 51) to seal the void is provided at pressure sensor region 16, as shown in FIG. 12. Also, a second interconnection 48*a* is formed at CMOS region 17. A silicon nitride film (not shown) having a thickness of approximately 0.5-1.0 μm, qualified as the passivation film, is formed so by plasma CVD as to cover first sealing film 48*b* and second interconnection 48*a* under a condition complying with the specification of the semiconductor device formed at CMOS region 17 (a relatively low temperature condition and the like).

Then, a resist mask (not shown) exposing the region where an opening is to be formed at pressure sensor region 16 is provided. By applying an etching process using that resist mask as an etching mask, the region of the silicon nitride film located at the region where an opening is to be formed is removed. Thus, a passivation film 52a is provided at CMOS region 17. A second sealing film 52b further closing etching hole 46b is formed at pressure sensor region 16. Accordingly, vacuum chamber 51 will be double-sealed by first and second sealing films 48b and 52b, allowing vacuum sealing of high reliability.

Alternative to the step of forming a first sealing film and a second interconnection set forth above, a plug such as of tungsten (W) may be formed at each etching hole 46b and contact hole 46a, followed by formation of a stacked film including a barrier metal film such as of titanium silicide ($TiSi_2$) or cobalt silicide ($CoSi_2$) and an aluminium copper (Al—Cu) film.

Thus, by forming first sealing film 48b and second interconnection 48a simultaneously and second sealing film 52b and passivation film 52a simultaneously, the CMOS standard process can be applied intentionally, contributing toward suppressing increase in the number of fabrication steps and reducing the fabrication cost.

Figure 13:
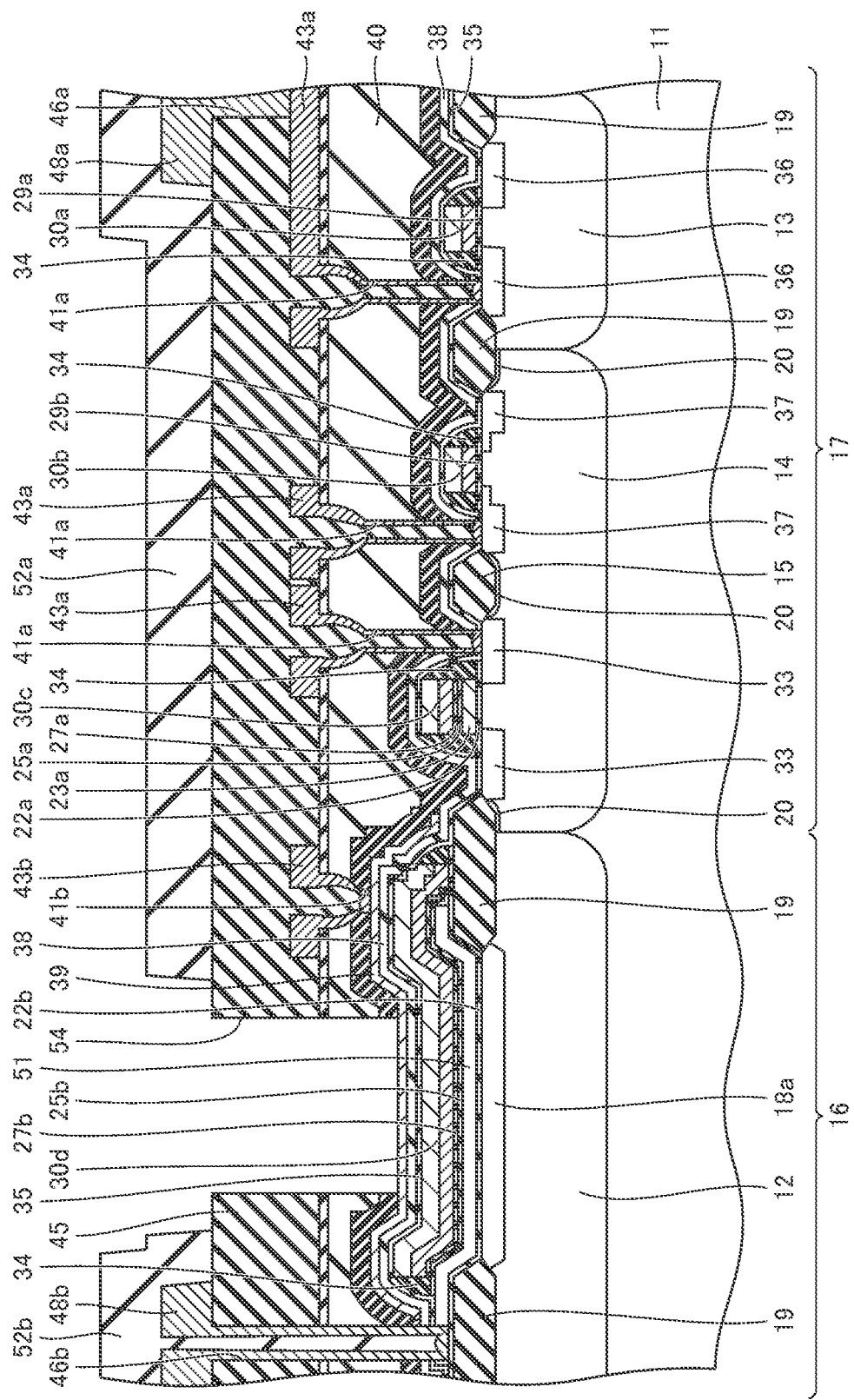
Figure 14:
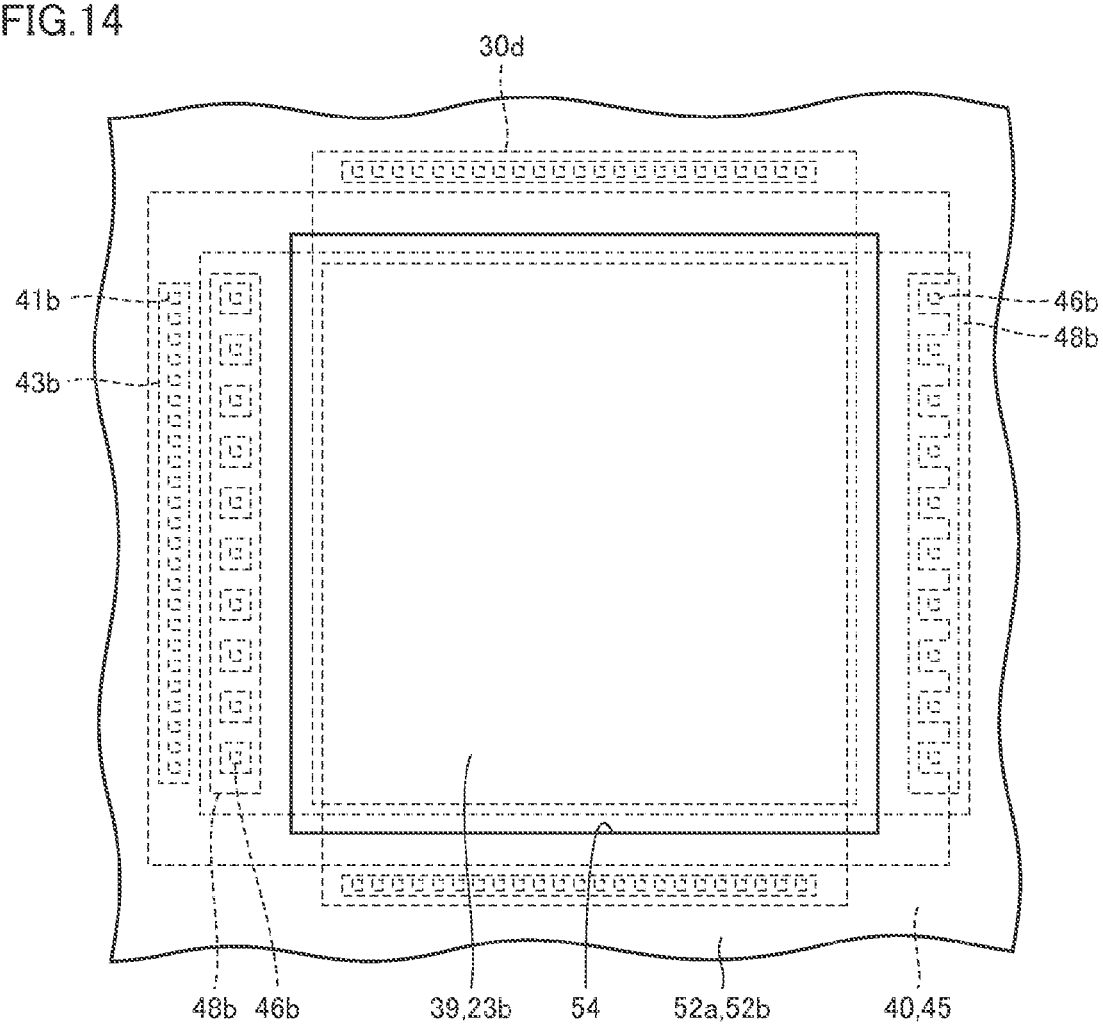
FIG. 14 is a partial plan view of a pressure sensor region at the step of FIG. 13 in the first embodiment.

Next, an opening is formed at pressure sensor region 16. First, a resist mask (not shown) directed to forming an opening at pressure sensor region 16 is provided. Using that resist mask as an etching mask, a dry etching process or an etching process based on a combination of dry etching and wet etching is applied. Accordingly, second interlayer insulation film 45 and first interlayer insulation film 40 are removed to form opening 54, as shown in FIGS. 13 and 14. Thus, the main part of the semiconductor pressure sensor is formed.

During formation of opening 54, shield film 39 made of a conductive polysilicon film functions as an etching stopper film. Shield film 39 serves to protect movable electrode 30d from damages during etching.

Opening 54 is provided by removing first interlayer insulation film 40 and second interlayer insulation film 45, subsequent to forming a void through removal of the sacrifice film and sealing the void qualified as a vacuum chamber by a first sealing film and the like. Therefore, during the step of forming a void through removal of the sacrifice film and the step of forming a vacuum chamber by closing the etching hole (vacuum chamber) by a first sealing film and the like, sufficient rigidity is exhibited above movable electrode 30d by virtue of first interlayer insulation film 40 and second interlayer insulation film 45 stacked on movable electrode 30d. Therefore, the sticking of movable electrode 30d can be prevented in the step of forming a void and in the step of providing a vacuum chamber by sealing the void. In other words, the phenomenon of movable electrode 30d adhering to the fixed electrode (substrate) side caused by the effect of surface tension during wet etching can be prevented.

In the above-described semiconductor pressure sensor, one side of movable electrode 30d at pressure sensor region 16 is open to the outer space through opening 54. Therefore, movable electrode 30d is displaced in response to external pressure, causing variation in the distance (gap) between fixed electrode 18a and movable electrode 30d. By detecting this variation in distance as a change in the capacitance value at the semiconductor pressure sensor, the pressure value is measured. Further, the semiconductor pressure sensor can function as an absolute pressure sensor by setting the pressure in vacuum chamber 51 located right below movable electrode 30d as the reference pressure.

In other words, the above-described semiconductor pressure sensor is of the capacitive type that measures a change in the capacitance as a pressure value. The capacitance value corresponds to change in the distance between movable electrode 30d and fixed electrode 18a. The pressure value is measured as a change in the capacitance value. More accurately, the capacitance value is the sum (total value) of the capacitance value of fixed electrode protection film 22b located between fixed electrode 18a and vacuum chamber 51 (capacitance value A), each capacitance value of first movable electrode protection film 25b and second movable electrode protection film 27b located between movable electrode 30d and vacuum chamber 51 (capacitance value B and capacitance value C), and the capacitance value of vacuum chamber 51 (capacitance value D).

Since only capacitance value D of vacuum chamber 51 varies depending upon the external pressure, the initial capacitance values of each of A-C (initial value) must be identified precisely in order to measure the pressure value more accurately.

However, it is difficult to properly identify the initial value of capacitance A of fixed electrode protection film 22b due to variation of the film thickness in forming first gate oxide film 22a qualified as fixed electrode protection film 22b, and variation in the reduced amount of fixed electrode protection film 22b during removal of sacrifice film 23b by etching.

Furthermore, it is difficult to properly identify the initial value of capacitance B of first movable electrode protection film 25b, likewise with capacitance value A, due to variation of the film thickness in forming second gate oxide film 25a qualified as first movable electrode protection film 25b and variation in the reduced amount of first movable electrode protection film 25b during removal of sacrifice film 23b by etching.

It is also difficult to properly identify the initial value of capacitance C of second movable electrode protection film 27b due to variation of the film thickness in forming first silicon nitride film 27a qualified as second movable electrode protection film 27b.

Figure 15:
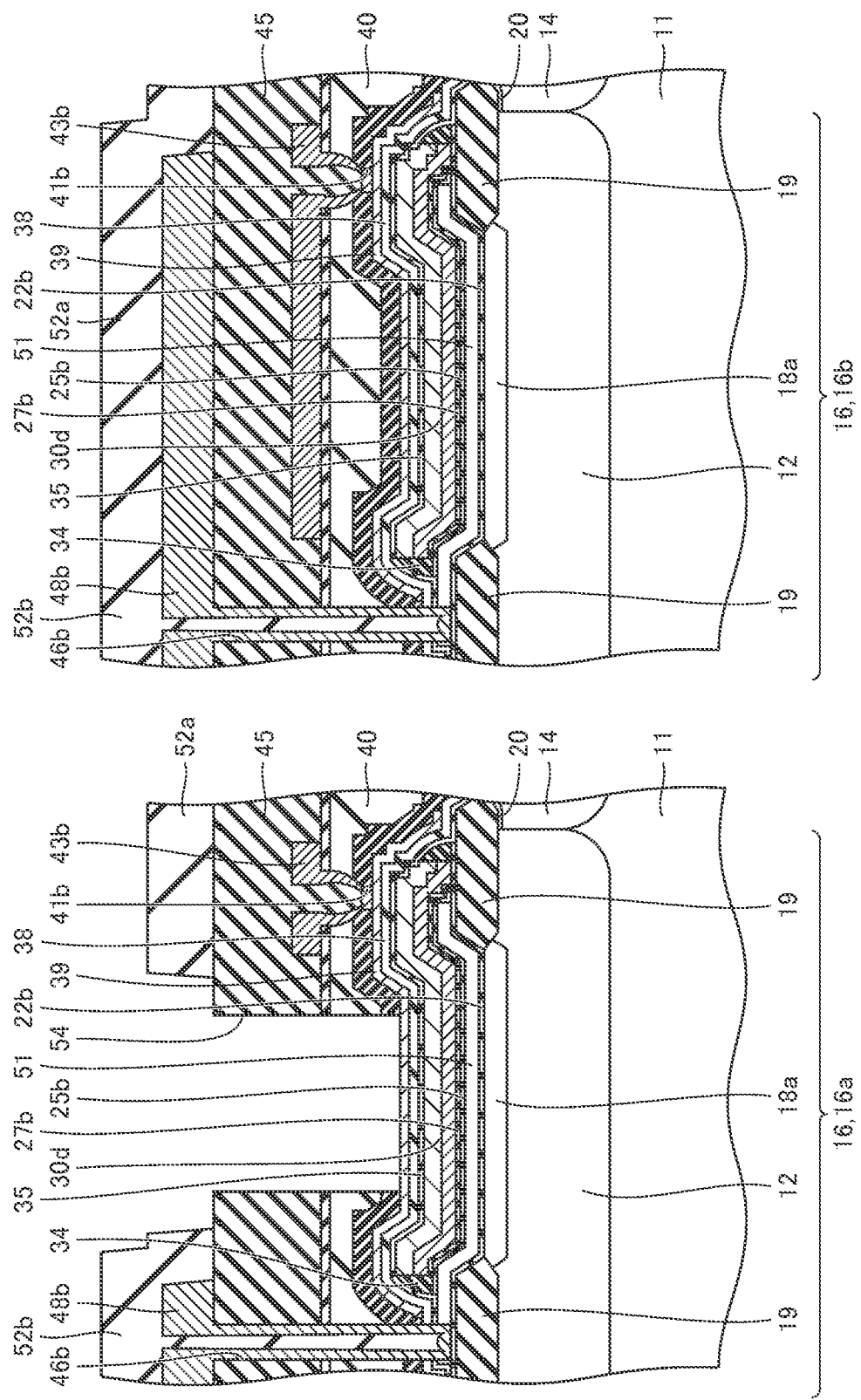
FIG. 15 is a partial sectional view representing a detection-oriented pressure sensor region and a reference-oriented pressure sensor region according to the first embodiment.

The method of arranging a reference-oriented pressure sensor region 16b absent of an opening in the proximity of a detection-oriented pressure sensor region 16a with opening 54 formed at pressure sensor region 16, as shown in FIG. 15, will be described hereinafter for the purpose of canceling such variation in the initial values.

At reference-oriented pressure sensor region 16b, first interlayer insulation film 40 and second interlayer insulation film 45 remain so as to cover movable electrode 30d. Also, interconnection 43b, first sealing film 48b and second sealing film 52b are provided so as to cover movable electrode 30d. Accordingly, the distance between movable electrode 30d and fixed electrode 18a does not change readily in response to change in the external pressure at reference-oriented pressure sensor region 16b. By subtracting a change in the capacitance value of the reference-oriented pressure sensor from the change in the capacitance value of the detection-oriented pressure sensor, variation in the initial values of capacitance values A-C can be canceled, allowing a change in the capacitance value caused by change in the external pressure to be sensed more accurately. As a result, measurement of a pressure value can be achieved at high accuracy.

The reference-oriented pressure sensor may be configured to prohibit variation in the movable electrode even if the external pressure changes by providing a plurality of anchors below the movable electrode to fix the movable electrode to the silicon substrate. Although the embodiment indicated in FIG. 15 has a stacked structure including interconnection 43b, first sealing film 48b and second sealing film 52b layered on movable electrode 30d, a similar advantage can be obtained even by a stacked structure including only first interlayer insulation film 40 and second interlayer insulation film 45.

In the fabrication method of a semiconductor pressure sensor set forth above, fixed electrode protection film 22b protecting fixed electrode 18a is formed at the same time in the step of forming first gate oxide film 22a. Sacrifice film 23b corresponding to vacuum chamber 51 by being removed is formed at the same time in the step of forming a polysilicon film qualified as the floating gate electrode of an EPROM. First movable electrode protection film 25b protecting the movable electrode is formed at the same time in the step of forming second gate oxide film 25a. Second movable electrode protection film 27b further protecting the movable electrode is formed at the same time in the step of forming first silicon nitride film 27a. Movable electrode 30d is formed at the same time in the step of forming gate electrodes 30a, 30b and 30c. First sealing film 48b is formed at the same time in the step of forming second interconnection 48a. Second sealing film 52b is formed at the same time in the step of forming passivation film 52a.

Thus, the CMOS standard process can be applied intentionally, contributing toward suppressing increase in the number of fabrication steps and reducing the production cost. Also, there is no need to add a step just of forming a semiconductor pressure sensor. Therefore, any damage to CMOS region 17 caused by thermal treatment and damage caused by dry etching or the like can be prevented. Further, fabrication of the semiconductor pressure sensor is facilitated. Moreover, degradation in the property as a semiconductor pressure sensor can be suppressed.

During removal of sacrifice film 23b, pressure sensor region 16 is protected by first interlayer insulation film 40 and second interlayer insulation film 45. First and second interlayer insulation films 40 and 45 are formed in the step of forming first and second interlayer insulation films 40 and 45 at CMOS region 17. Accordingly, it is not necessary to additionally form a film for protecting the pressure sensor region prior to removal of sacrifice film 23b. It is also not necessary to additionally remove the protection film, after removal of the sacrifice film. As a result, the fabrication steps can be reduced, allowing the production cost to be lowered. Moreover, processing damage on pressure sensor region 16 and CMOS region 17 can be suppressed by first interlayer insulation film 40 and second interlayer insulation film 45.

At pressure sensor region 16, movable electrode 30d is covered with a shield film 39 made of a conductive polysilicon film. Accordingly, direct contact of movable electrode 30d with the outside can be prevented. In addition, connection of shield film 39 covering movable electrode 30d to ground potential blocks out the effect of externally applied charge and the like, allowing property variation of the semiconductor pressure sensor to be suppressed.

Furthermore, shield film 39 functions as an etching stopper film in the etching process directed to forming opening 54 in first interlayer insulation film 40 and second interlayer insulation film 45 covering movable electrode 30d. Accordingly, movable electrode 30d can be protected from damage in association with the etching process. Also, by adjusting the film thickness of shield film 39 (the film thickness of the conductive polysilicon film), the stress property and the pressure detection sensitivity property of movable electrode 30d can be controlled.

Furthermore, by forming reference-oriented pressure sensor region 16b, and subtracting a change in the capacitance value of the reference-oriented pressure sensor from a change in the capacitance value of a pressure sensor at detection-oriented pressure sensor region 16a, variation in the initial value of the capacitance can be canceled. Accordingly, a change in the capacitance value caused by change in external pressure can be sensed more precisely, allowing measurement of a pressure value at higher accuracy.

During the step of forming a void through removal of the sacrifice film and the step of providing a vacuum chamber 51 by closing etching hole 46b by a first sealing film and the like, first interlayer insulation film 40 and second interlayer insulation film 45 are stacked on movable electrode 30d. Therefore, sufficient rigidity is exhibited above movable electrode 30d. The sticking of movable electrode 30d can be prevented in the step of forming a void and in the step of providing a vacuum chamber by sealing the void.

Second Embodiment

The semiconductor pressure sensor set forth above was described based on an exemplified fixed electrode formed of a diffusion region where impurities were diffused. In the second embodiment, a semiconductor pressure sensor will be described including a fixed electrode formed of a conductive polysilicon film such as a doped polysilicon film. Elements in the fabrication steps similar to those in the first embodiment have the same reference characters allotted, and description thereof will not be repeated unless necessary.

Figure 16:
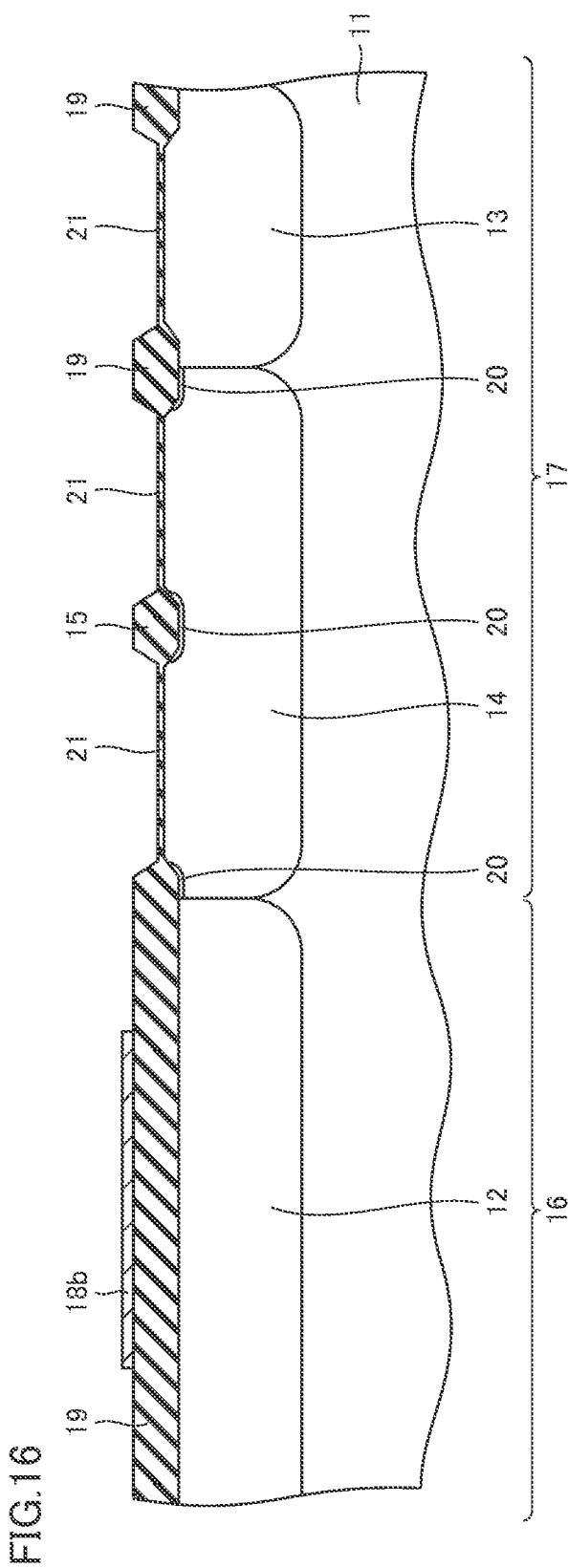
FIG. 16 is a sectional view representing a step in a fabrication method of a semiconductor pressure sensor according to a second embodiment of the present invention.
Figure 17:
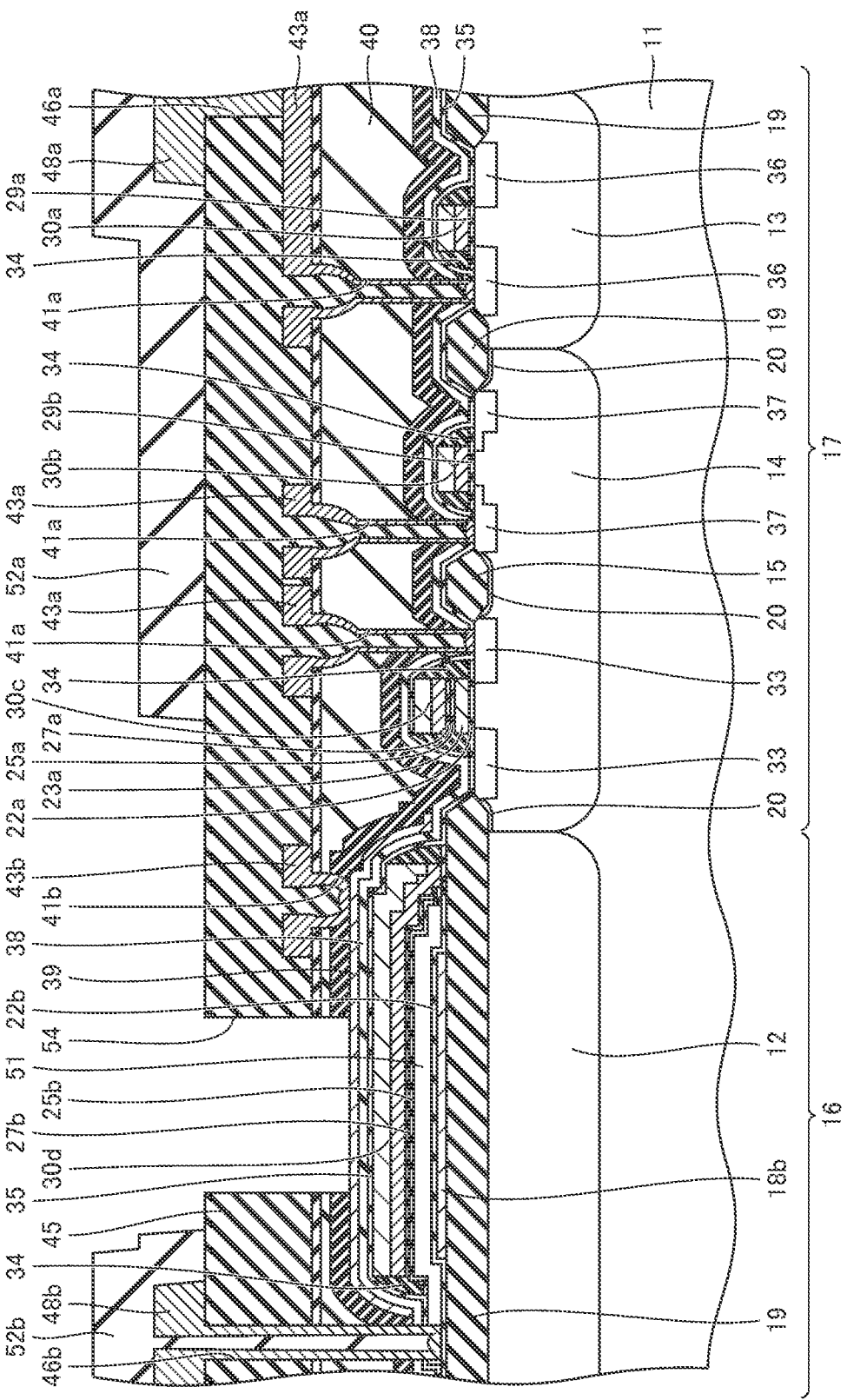
FIG. 17 is a sectional view representing a step performed after the step of FIG. 16 in the second embodiment.

Following a step similar to the step shown in FIG. 1, a field oxide film 19 is formed at pressure sensor region 16 whereas field oxide films 15 and 19 are formed at CMOS region 17, as shown in FIG. 16, by LOCOS set forth before in association with FIG. 2. Then, a conductive doped polysilicon film (not shown) is formed so as to cover field oxide films 15 and 19. Photolithography is applied to provide a resist mask (not shown) directed to establishing a pattern of a fixed electrode. By etching using that resist mask as an etching mask, fixed electrode 18b is formed. Then, through steps similar to those shown in FIGS. 3-13, the main part of the semiconductor pressure sensor is completed, as shown in FIG. 17.

Thus, the semiconductor pressure sensor of the second embodiment includes the following advantages, in addition to the aforementioned advantages obtained by the previous semiconductor pressure sensor. The formation of fixed electrode 18b made of a conductive polysilicon film on field oxide film 19 causes the parasitic capacitance between fixed electrode 18b and silicon substrate 11 as well as the parasitic capacitance between fixed electrode 18b and first well region 12 to be reduced. Accordingly, the initial capacitance value is reduced, allowing the rate of the change in the capacitance value when movable electrode 30d is displaced by pressure change to become relatively greater. As a result, the pressure detection sensitivity can be improved.

According to the structure in which fixed electrode 18b is formed on field oxide film 19, the top face of the silicon substrate corresponding to pressure sensor region 16 where field oxide film 19 is formed may be recessed downward by etching in advance or the like. Accordingly, the difference in level from CMOS region 17 is reduced, allowing photolithography to be performed accurately at a subsequent step.

Third Embodiment

The third embodiment corresponds to the case where a first sealing film closing an etching hole for formation of a vacuum chamber and a second interconnection at the CMOS region are formed in separate fabrication steps. Elements in the fabrication steps similar to those in the first embodiment have the same reference characters allotted, and description thereof will not be repeated unless necessary.

Figure 18:
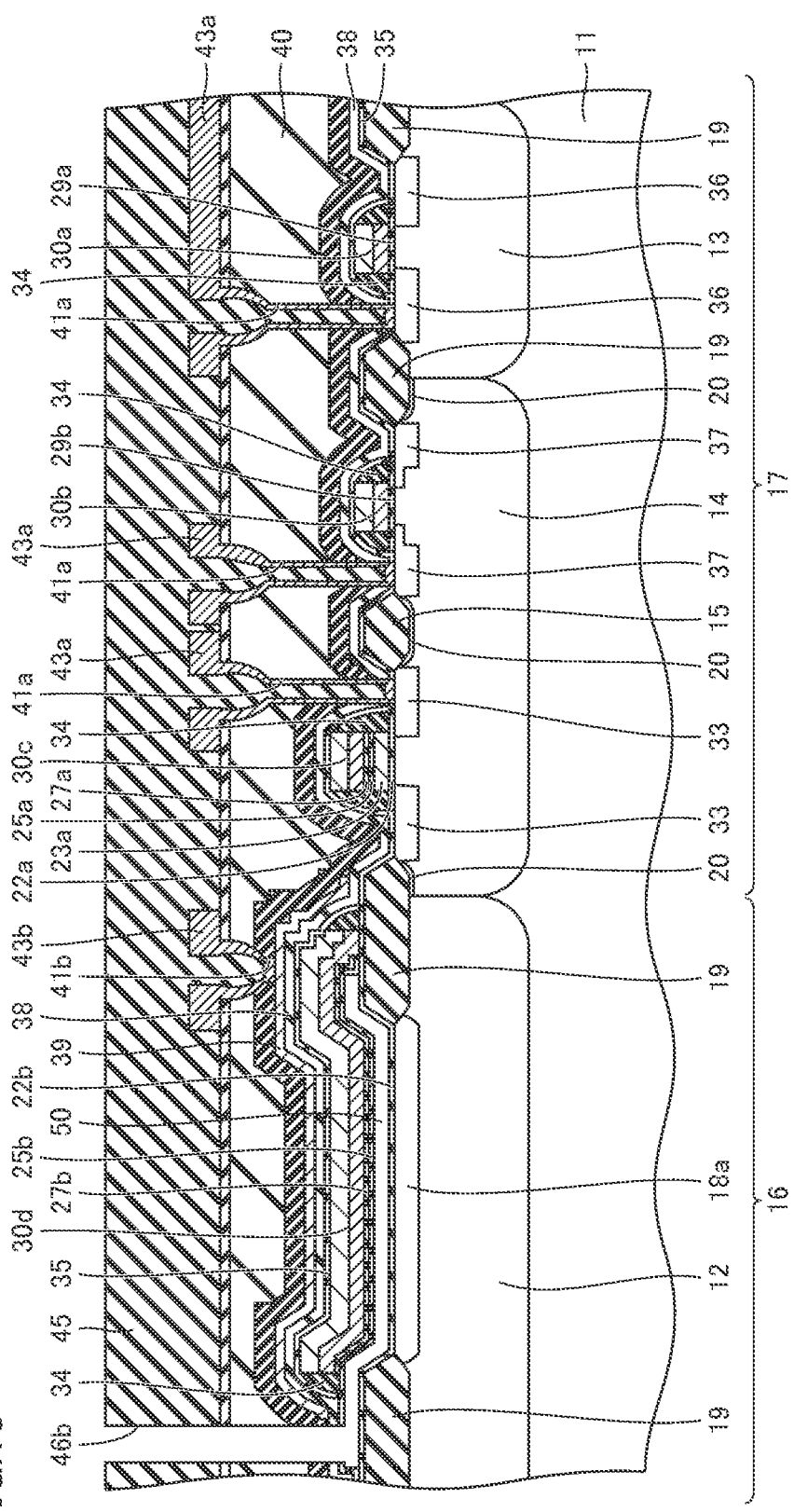
FIG. 18 is a sectional view representing a step in a fabrication method of a semiconductor pressure sensor according to a third embodiment of the present invention.

Subsequent to steps similar to those shown in FIGS. 1-10 described in the first embodiment, an etching hole is formed at the pressure sensor region in the third embodiment. At this stage, a resist mask (not shown) directed to forming etching hole 46b is provided. Using that resist mask as an etching mask, a dry etching process or an etching process based on a combination of dry etching and wet etching is applied to the second interlayer insulation film and the like to form etching hole 46b, as shown in FIG. 18. Then, the resist mask is removed.

Next, wet etching is performed through etching hole 46b using TMAH as the chemical agent to remove sacrifice film 23b made of a polysilicon film, whereby a void 50 is formed. Then, a predetermined metal film (not shown) is formed by, for example, vapor deposition or sputtering. By the provision of a metal film in vacuum at this stage, void 50 is reduced in pressure to be qualified as a vacuum chamber 51. This vacuum chamber 51 is sealed by the metal film (first sealing film 48b).

Figure 19:
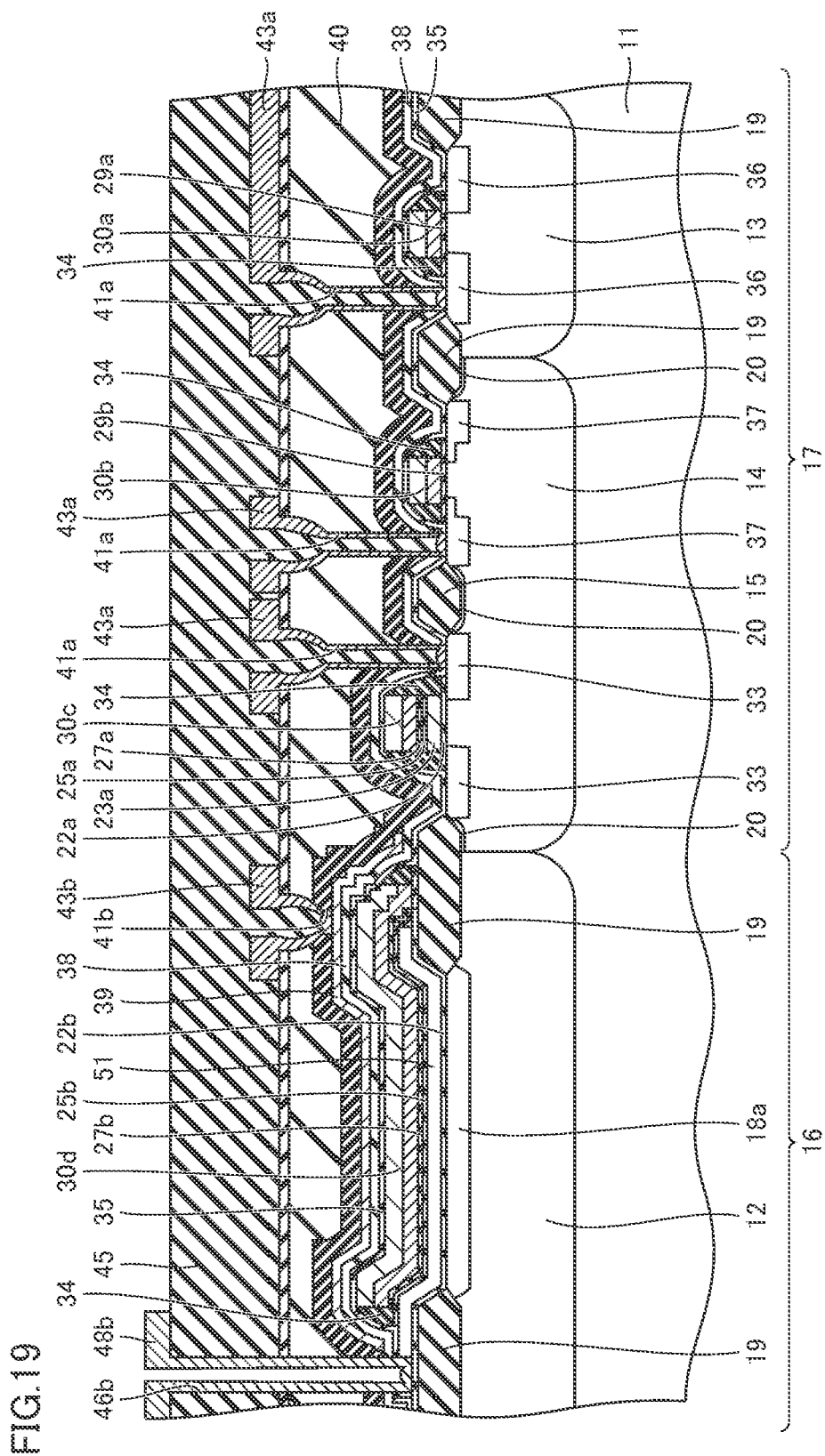
FIGS. 19-21 are sectional views representing a step performed after the step of a preceding drawing in the third embodiment.

By establishing a pattern on the metal film, first sealing film 48b closing etching hole 46b is provided, as shown in FIG. 19. For the metal film, a film applied in a CMOS process such as an aluminium (Al) film, aluminium silicon (Al—Si) film, aluminium silicon copper (Al—Si—Cu) film, aluminium copper (Al—Cu) film or the like is used. Here, a pretreatment step is not required before providing a metal film since the object of the aforementioned step is to close the etching hole with a metal film. The step of forming a barrier metal film is also not necessary.

Figure 20:
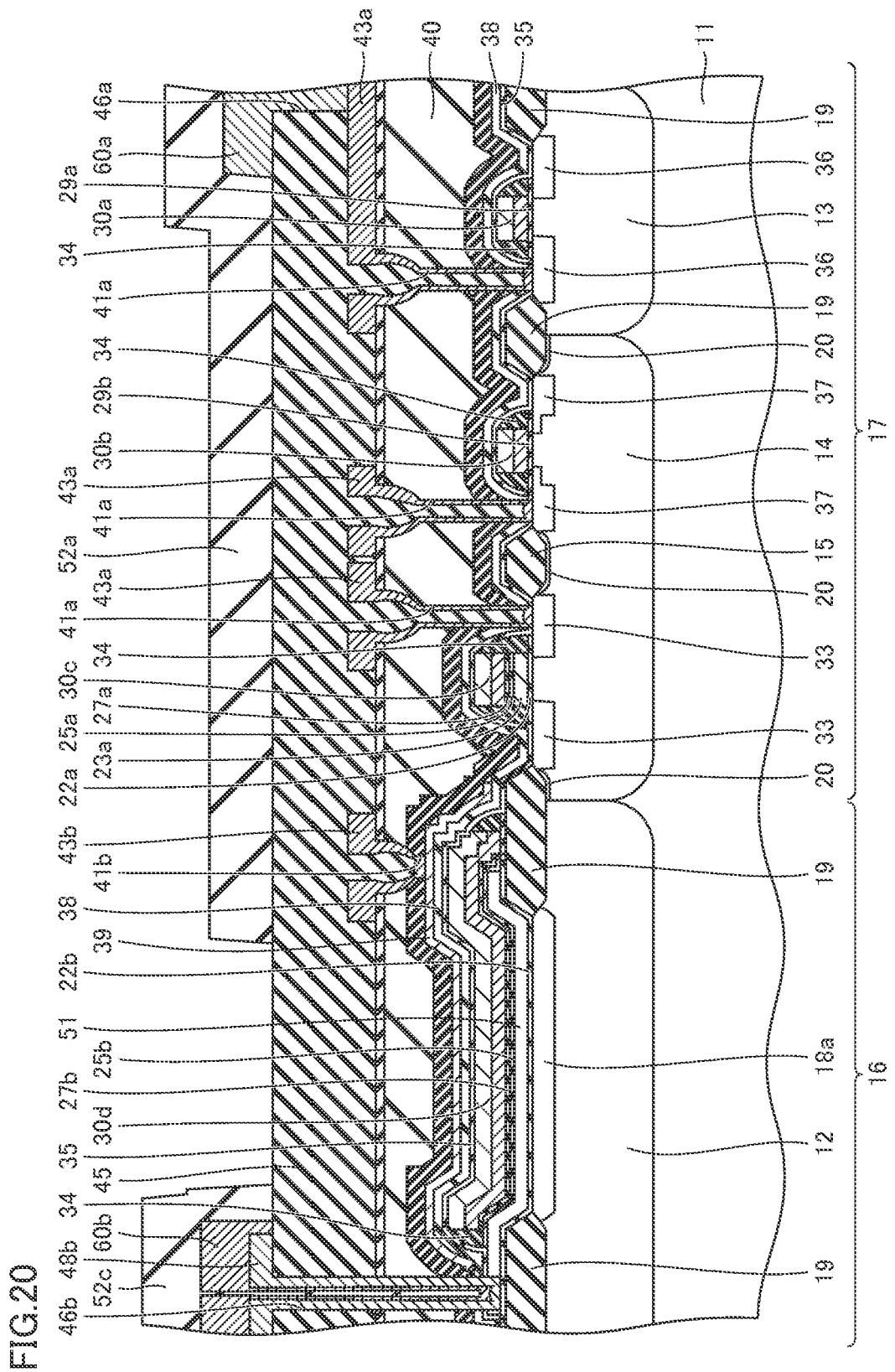

Next, a resist mask (not shown) directed to forming contact hole 46a is provided. Using that resist mask as an etching mask, a dry etching process or an etching process based on a combination of dry etching and wet etching is applied to the second interlayer insulation film 45 to form contact hole 46a at CMOS region 17, as shown in FIG. 20. Subsequently, the resist mask is removed.

Then by vapor deposition or sputtering, a predetermined metal film is formed under a condition complying with the specification of the device formed at CMOS region 17. For the metal film, a stacked film including a barrier metal film such as of titanium nitride (TiN) and an aluminium silicon copper (Al—Si—Cu) film is formed. By establishing a pattern on the stacked film, a second interconnection 60a is formed at CMOS region 17 and a second sealing film 60b is formed so as to cover first sealing film 48b at pressure sensor region 16, as shown in FIG. 20.

Figure 21:
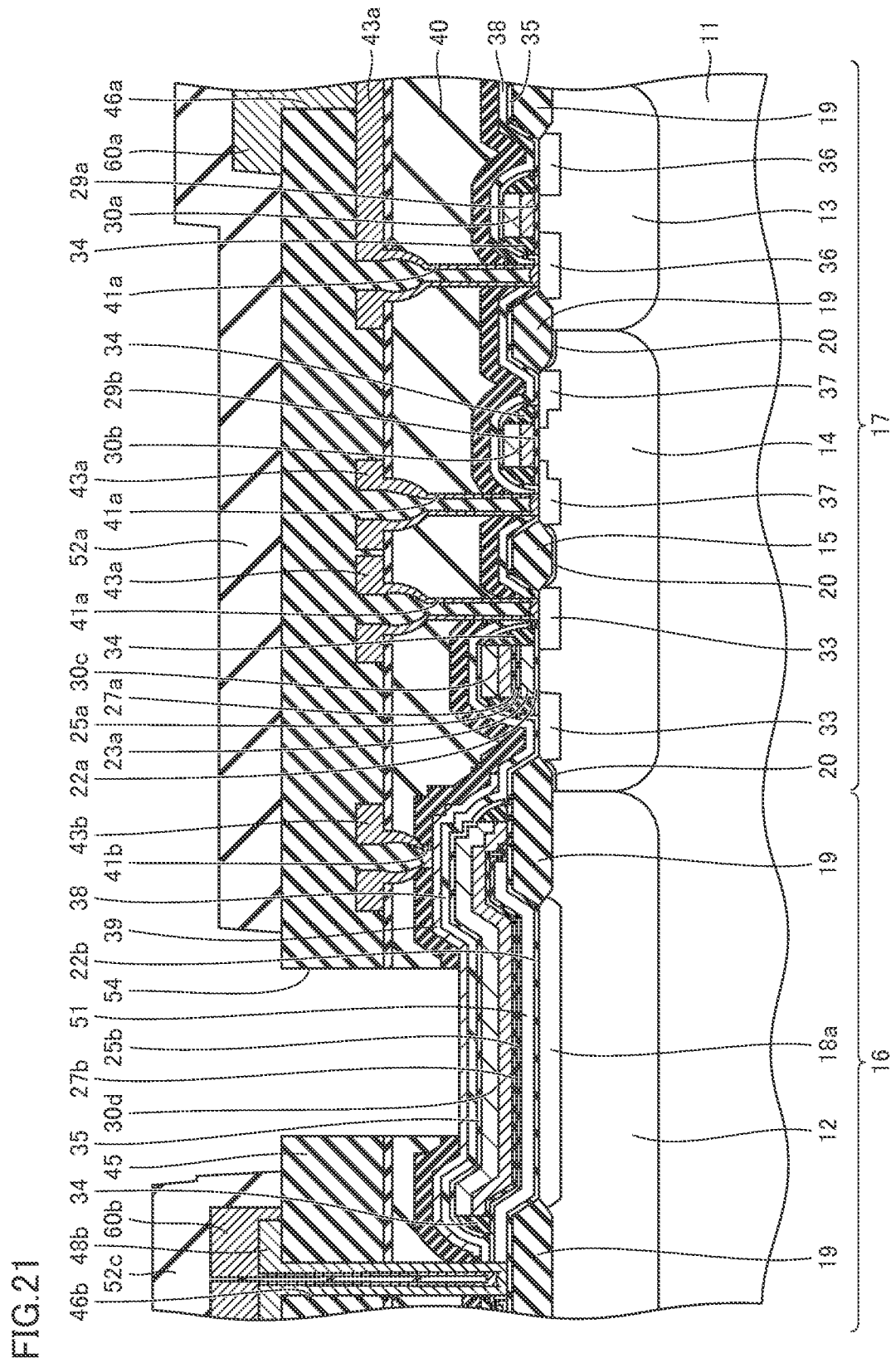

In a manner similar to that described in the step shown in FIG. 12, a passivation film 52a is formed at CMOS region 17, as shown in FIG. 20. At pressure sensor region 16, a passivation film 52c is formed. In the case of an interconnection structure in which a multilayer interconnection is not formed, a contact hole may be formed only at the pad region (not shown) in CMOS region 17, and a passivation film may be formed without provision of a second interconnection, followed by patterning. Then, a step similar to that shown in FIG. 13 is performed to form an opening 54 at pressure sensor region 16, as shown in FIG. 21. Thus, the main part of the semiconductor pressure sensor is completed.

The present semiconductor pressure sensor is formed through steps similar to those described in the first embodiment except that first sealing film 48b closing etching hole 46b directed to forming vacuum chamber 51 and second interconnection 60a at CMOS region 17 are provided in separate fabrication steps. Therefore, advantages substantially similar to those described in the first embodiment can be obtained.

By forming first sealing film 48b and second interconnection 60a in separate fabrication steps in the present semiconductor pressure sensor, a process prior to forming a sealing film (pretreatment) is not required. Accordingly, the degree of freedom in designing such as selecting the optimum film thickness and film type for first sealing film 48b is increased, facilitating fabrication of the semiconductor pressure sensor. The aforementioned pretreatment corresponding to wet etching becomes the cause of sticking at the region of void 50. By employing the step of forming first sealing film 48b as an exclusive step not requiring pretreatment, a semiconductor pressure sensor of high accuracy can be obtained readily. Furthermore, vacuum chamber 51 can be sealed reliably by closing etching hole 46b with first sealing film 48b and second sealing film 60b.

Fourth Embodiment

A semiconductor pressure sensor of an FET (Field Effect Transistor) operating type including a source/drain region as a fixed electrode will be described according to a fourth embodiment. Elements in the fabrication steps similar to those in the first embodiment have the same reference characters allotted, and description thereof will not be repeated unless necessary.

Figure 22:
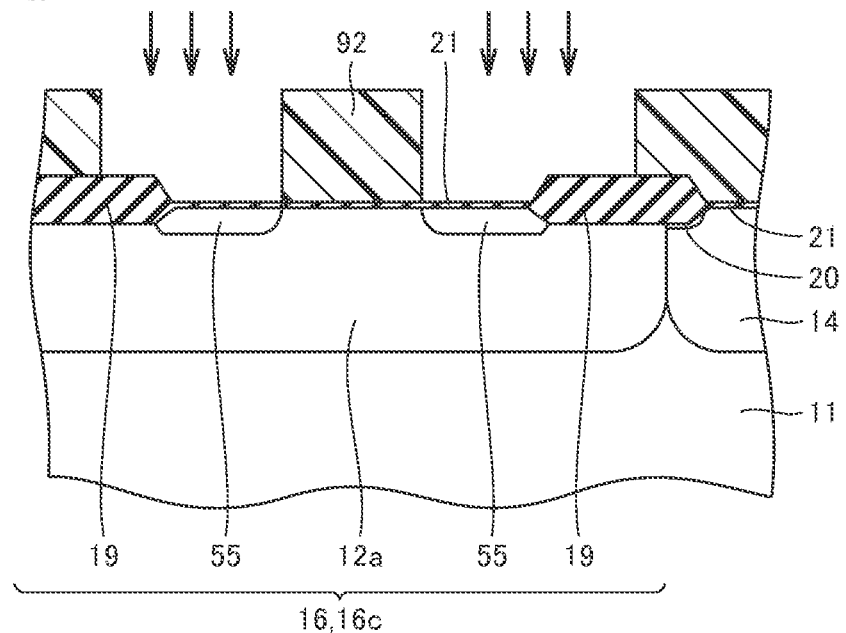
FIG. 22 is a partial sectional view representing a step in a fabrication method of a semiconductor pressure sensor according to a fourth embodiment of the present invention.

Subsequent to a step similar to that shown in FIG. 1, a p type fourth well region 12b (refer to FIGS. 22 and 23) is formed in addition to n type first well region 12a at pressure sensor region 16. Then, a field oxide film 19 (refer to FIGS. 22 and 23) is formed at pressure sensor region 16 by the aforementioned LOCOS described with reference to FIG. 2. As shown in FIG. 22, a resist mask 92 directed to forming a p type source/drain region is provided at pressure sensor region 16c. By implanting p type impurities (for example, boron) using resist mask 92 as an implantation mask, a pair of p type source/drain regions 55 is provided. Then, resist mask 92 is removed.

Figure 23:
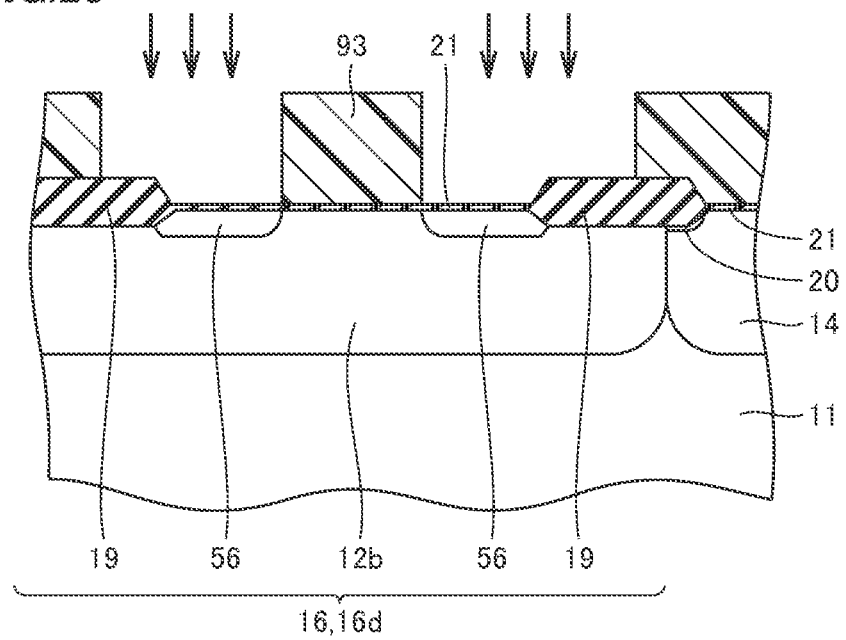

As shown in FIG. 23, a resist mask 93 directed to forming an n type source/drain region is provided at pressure sensor region 16d. By implanting n type impurities (for example, arsenic) using resist mask 93 as an implantation mask, a pair of n type source/drain regions 56 is provided. Then, resist mask 93 is removed. Through steps similar to those shown in FIGS. 3-13, the main part portion of an FET operating type semiconductor pressure sensor is completed, as shown in FIG. 24.

In the FET operating type semiconductor pressure sensor, a p-channel FET operating type pressure sensor is formed at pressure sensor region 16c, whereas an n-channel FET operating type pressure sensor is formed at pressure sensor region 16d. At the p-channel FET operating type pressure sensor, p type source/drain regions 53 are formed as the fixed electrode. At the n-channel FET operating type pressure sensor, n type source/drain regions 56 are formed as the fixed electrode.

In this semiconductor pressure sensor, displacement of movable electrode 30d in response to pressure causes change in the distance between silicon substrate 1 and movable electrode 30d, resulting in a change in the capacitance value. Therefore, the value of current flowing from one to the other of p type (n type) source/drain regions 55 (56) constituting a pair changes. This change in the current value is measured as the pressure value.

The present semiconductor pressure sensor is formed through fabrication steps similar to those described in the first embodiment except for a pair of p type (n type) source/drain regions 55 (56) being formed as the fixed electrode. Accordingly, advantages substantially similar to those described in the first embodiment are obtained in the fourth embodiment.

Fifth Embodiment

The present embodiment corresponds to the case where a vacuum chamber (etching hole) is formed prior to forming a contact hole in the CMOS region. Elements in the fabrication steps similar to those in the first embodiment have the same reference characters allotted, and description thereof will not be repeated unless necessary.

Figure 25:
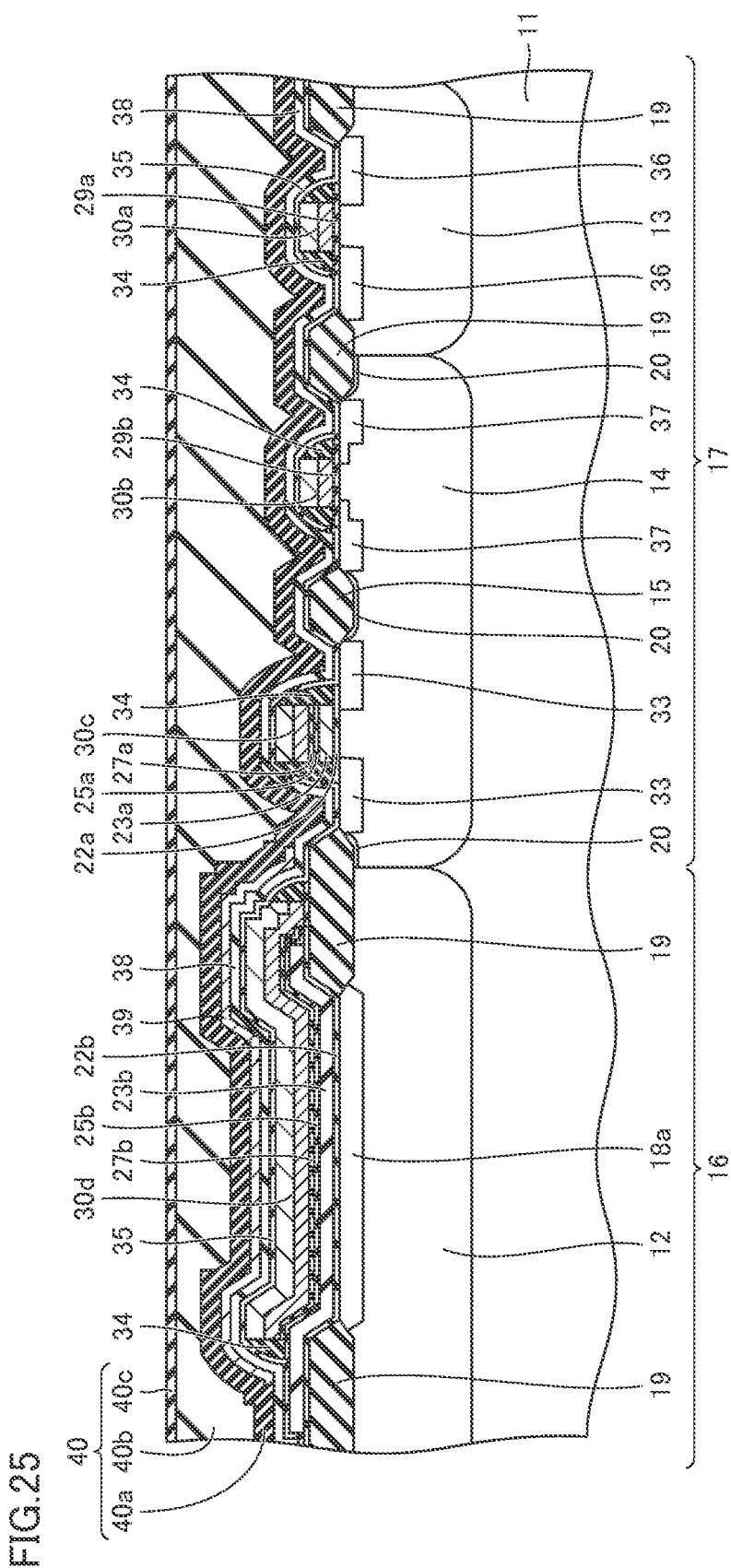
FIG. 25 is a sectional view representing a step in a fabrication method of a semiconductor pressure sensor according to a fifth embodiment of the present invention.
Figure 26:
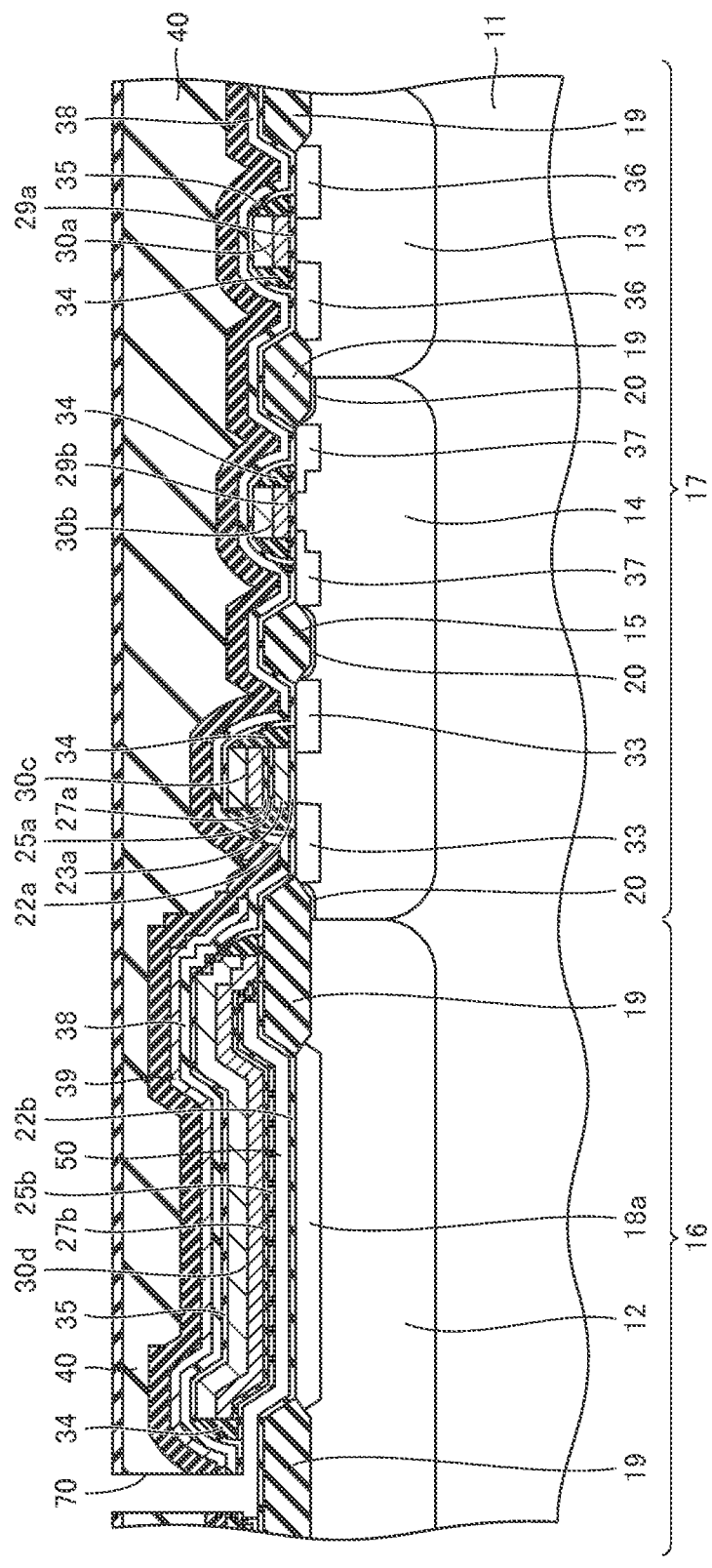
FIGS. 26-30 are sectional views representing a step performed after the step of a preceding drawing in the fifth embodiment.

Subsequent to steps similar to those indicated in FIGS. 1-8, first interlayer insulation film 40 is formed in the fifth embodiment, as shown in FIG. 25. By photolithography, a resist mask (not shown) directed to forming an etching hole is provided. By applying an etching process using the resist mask as an etching mask, an etching hole 70 directed to etching the sacrifice film is formed at pressure sensor region 16, as shown in FIG. 26. Then, the resist mask is removed.

By applying wet etching via etching hole 70 to remove sacrifice film 23b, void 50 is formed. FIG. 26 corresponds to the step at this stage. As the chemical agent for wet etching, TMAH, for example, is used. In addition to wet etching, dry etching applying xenon difluoride ($XeF_2$) may be carried out.

Then, the process of setting void 50 as a vacuum chamber is performed. A predetermined metal film is formed by, for example, vapor deposition or sputtering. For the metal film, a film applied in the CMOS process such as an aluminium (Al) film, an aluminium silicon (Al—Si) film, an aluminium silicon copper (Al—Si—Cu) film, an aluminium copper (Al—Cu) film or the like is used. By the provision of a metal film in vacuum at this stage, void 50 is reduced in pressure to be qualified as a vacuum chamber 51. This vacuum chamber 51 is sealed by the metal film (first sealing film 71).

Figure 27:
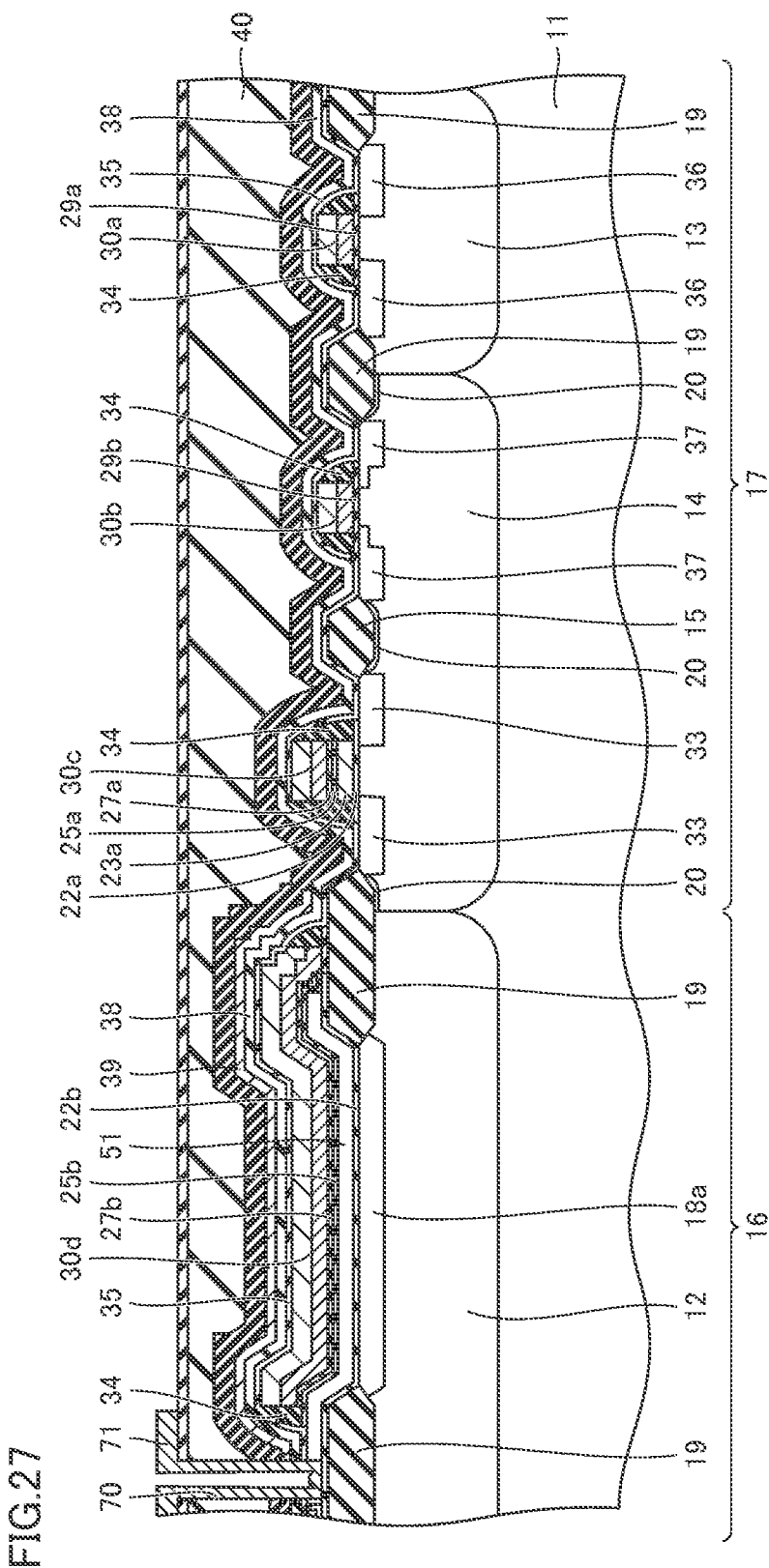

By establishing a pattern on the metal film, first sealing film 71 that closes etching hole 70 (vacuum chamber 51) to seal the void is formed, as shown in FIG. 27. Here, a pretreatment step is not required before providing a metal film since the object of the aforementioned step is to close the etching hole with a metal film. The step of forming a barrier metal film is also not necessary.

Figure 28:
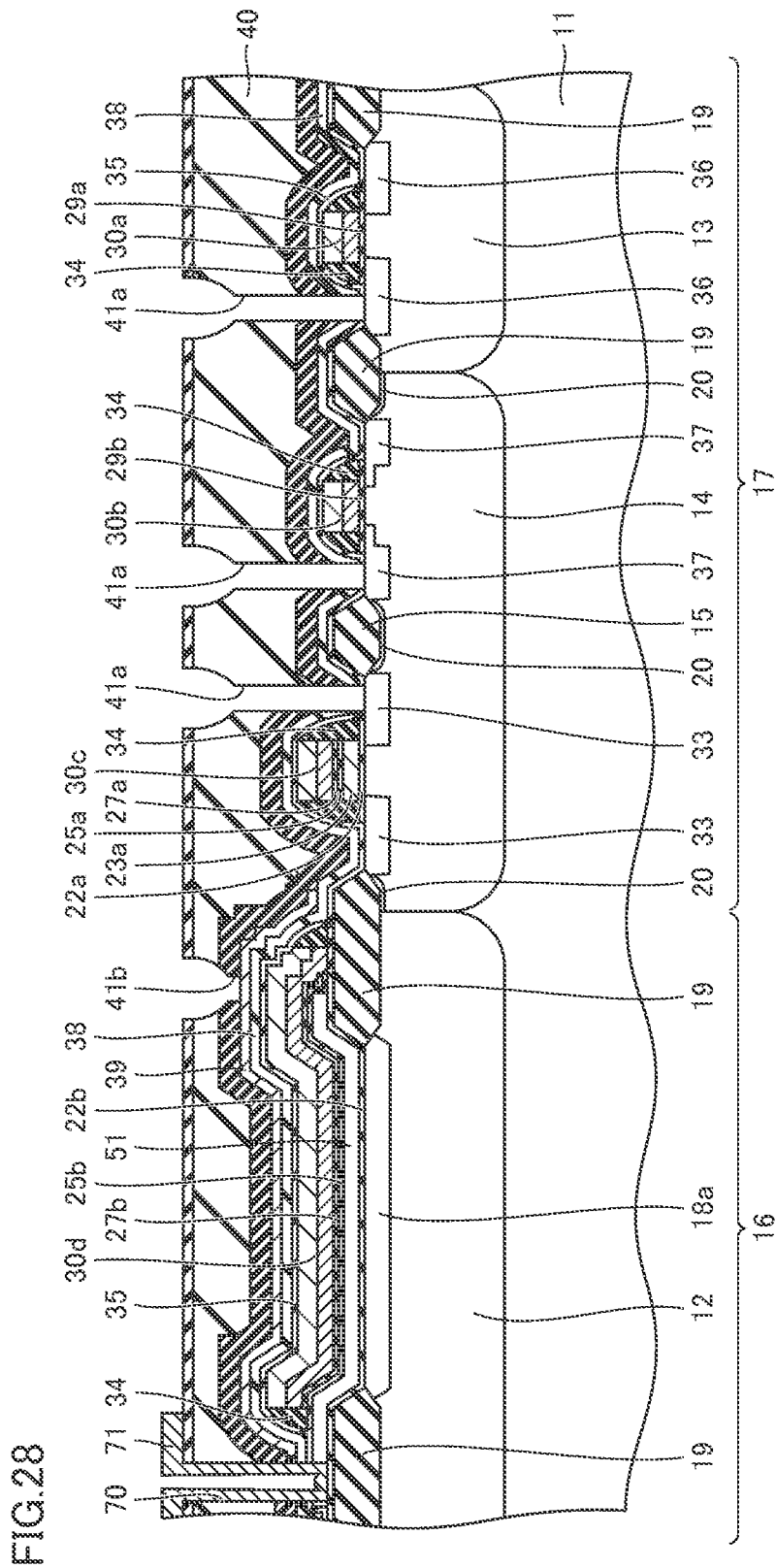

By photolithography, a resist mask (not shown) directed to forming a contact hole is provided. Using that resist mask as an etching mask, an etching process is applied to the first interlayer insulation film and the like under a condition complying with the specification of a semiconductor device formed at CMOS region 17. Accordingly, contact hole 41a is formed at CMOS region 17 whereas contact hole 41b is formed at pressure sensor region 16, as shown in FIG. 28. Then, the resist mask is removed.

Figure 29:
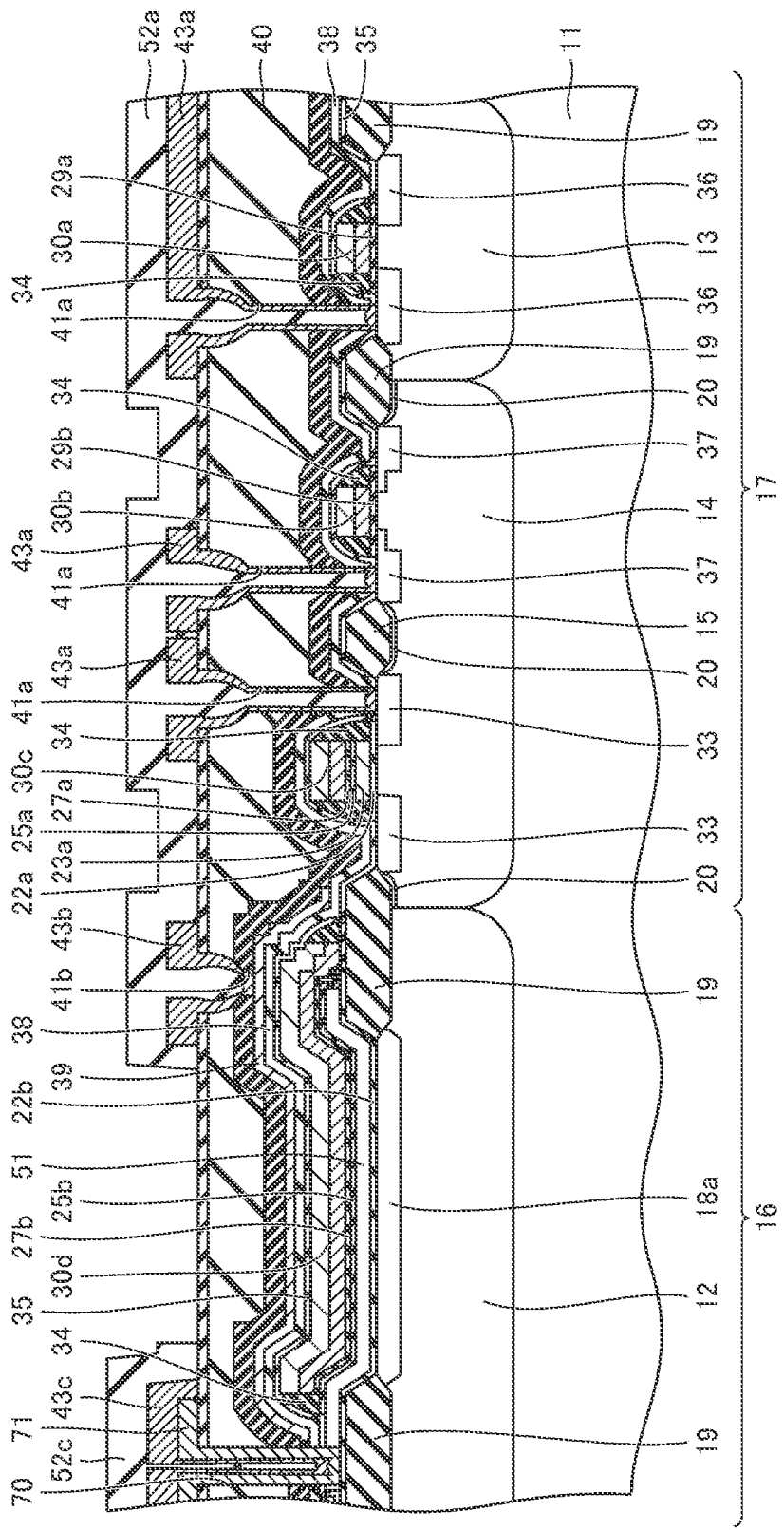

By applying a light etching process using diluted hydrofuloric acid (HF) as the pretreatment, prior to forming a first interconnection, the natural oxide (not shown) in contact holes 41a and 41b are removed. Then, a barrier metal film and an aluminium silicon copper (AlSiCu) film (both not shown) are formed so as to cover first interlayer insulation film 40. For the barrier metal film, a titanium nitride (TiN) film, for example, is applied. By establishing a pattern on the aluminium silicon copper film or the like, first interconnection 43a is formed at CMOS region 17, as shown in FIG. 29. At pressure sensor region 16, interconnection 43b electrically connected to shield film 39 is formed. Also, second sealing film 43c closing etching hole 70 is formed.

Then, a silicon nitride film (not shown) having a film thickness of approximately 0.5-1.0 μm, qualified as a passivation film, is formed so as to cover second sealing film 43c and first interconnection 43a under a condition complying with the specification of the semiconductor device formed at CMOS region 17.

Then, a resist mask (not shown) exposing a region where an opening is to be formed is provided at pressure sensor region 16. By applying an etching process using that resist mask as an etching mask, the region of the silicon nitride film located at the region where an opening is to be formed is removed. Accordingly, passivation film 52a is formed at CMOS region 17, as shown in FIG. 29. At pressure sensor region 16, a passivation film 52c further closing etching hole 70 is formed.

Figure 30:
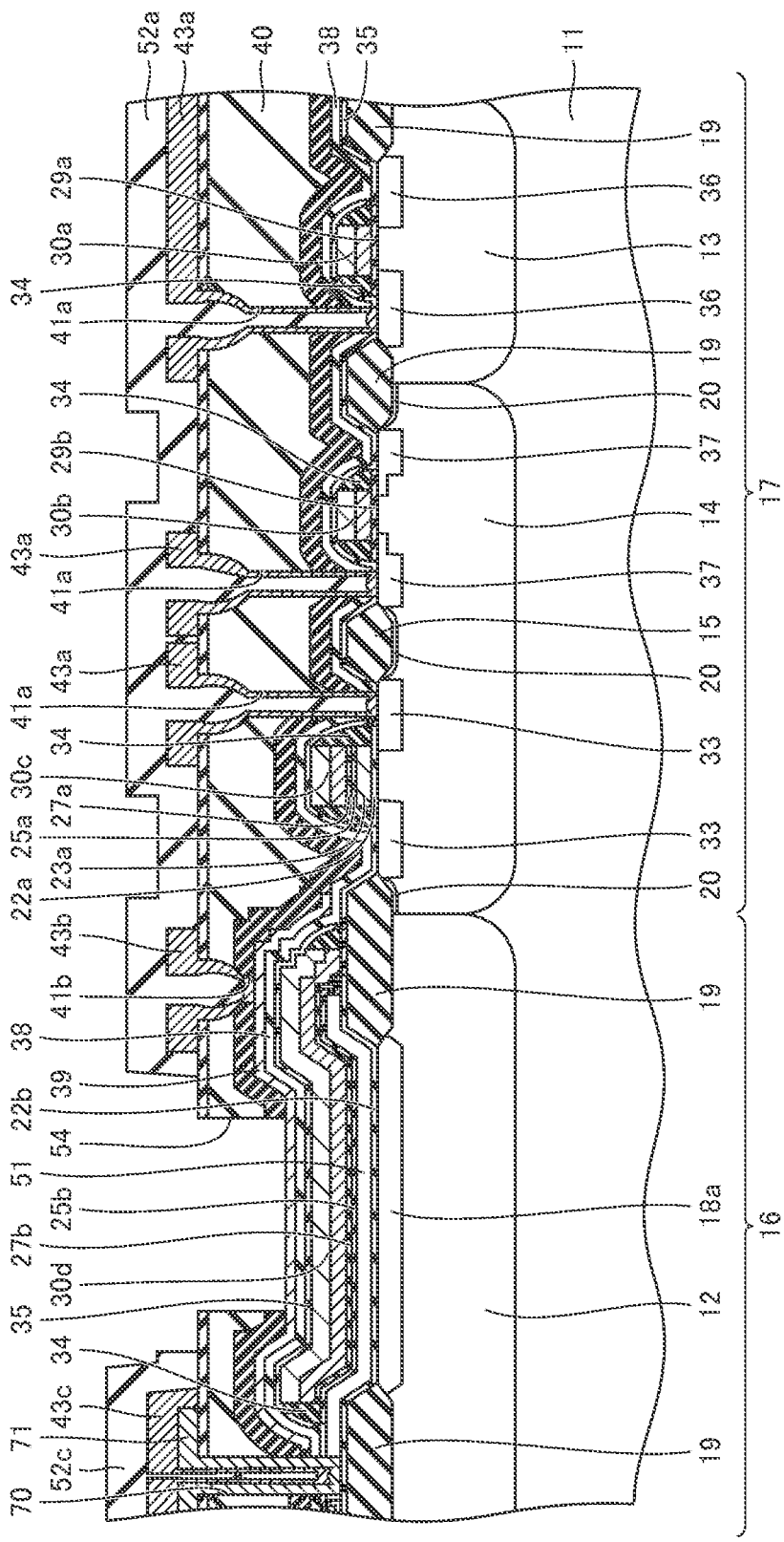
Figure 31:
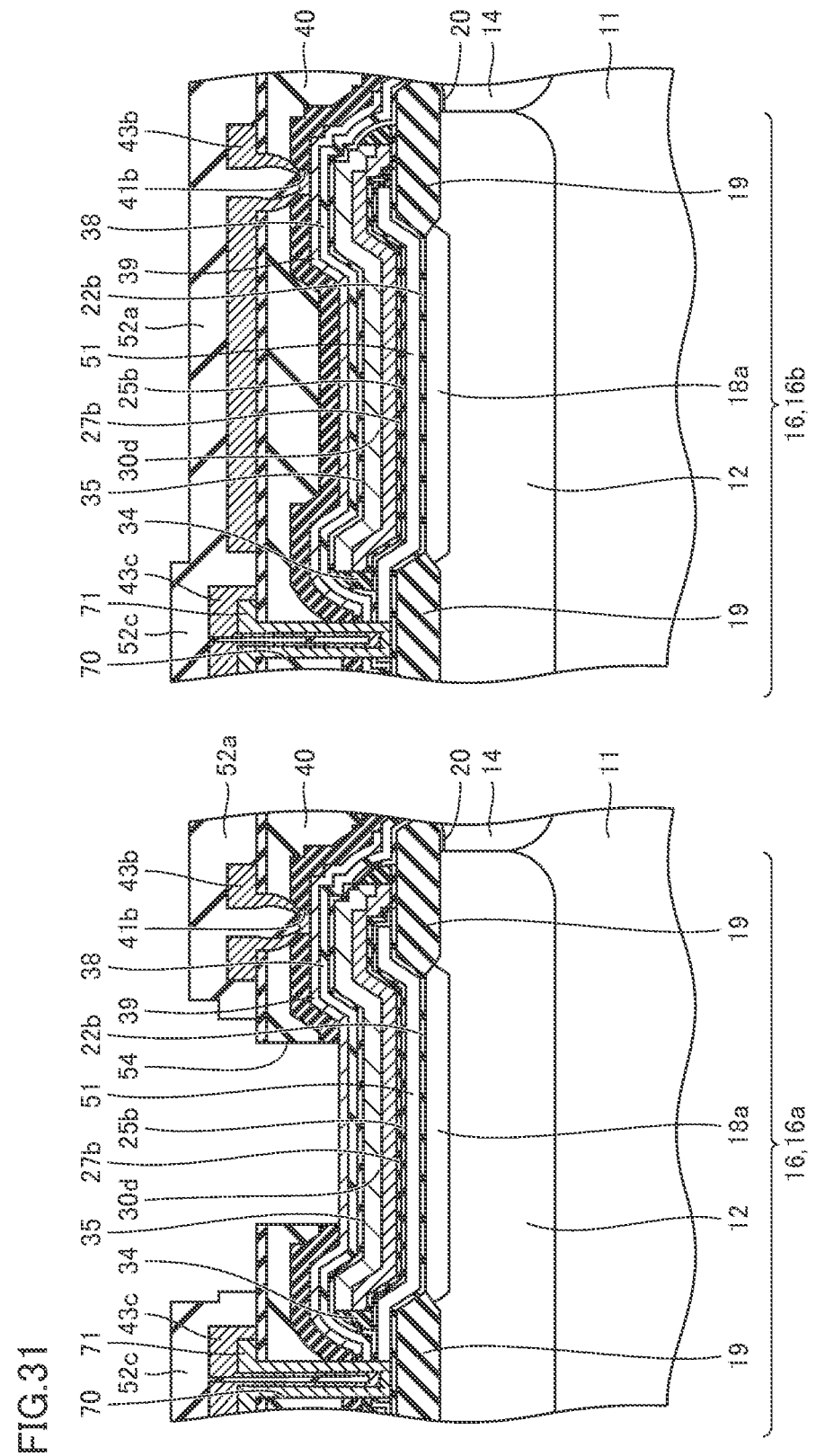
FIG. 31 is a partial sectional view representing a detection-oriented pressure sensor region and a reference-oriented pressure sensor region according to the fifth embodiment.

Then, a resist mask (not shown) directed to forming an opening at the pressure sensor region is provided. Using that resist mask as an etching mask, a dry etching process or an etching process based on a combination of dry etching and wet etching is performed. Thus, first interlayer insulation film 40 is removed to form opening 54 at detection-oriented pressure sensor region 16a, as shown in FIGS. 30 and 31. At reference-oriented pressure sensor region 16b, first interlayer insulation film 40 remains. Although FIG. 31 shows interconnection 43b further layered on first interlayer insulation film 40, only first interlayer insulation film 40 may be provided instead. Thus, the main part of the semiconductor pressure sensor is formed.

The present semiconductor pressure sensor is formed basically through fabrication steps similar to those described in the first embodiment, except for the second interlayer insulation film and second interconnection not being formed. Thus, advantages substantially similar to those described in the first embodiment are obtained.

Sixth Embodiment

The sixth embodiment corresponds to the case where the second interlayer insulation film is formed in two divided steps. In this case, the region equivalent to a first segment film formed first is qualified as the protection film required in the removal of the sacrifice film through etching. The region equivalent to a second segment film formed at the second time is qualified as the film for closing the etching hole. Elements in the fabrication steps similar to those in the first embodiment have the same reference characters allotted, and description thereof will not be repeated unless necessary.

Figure 32:
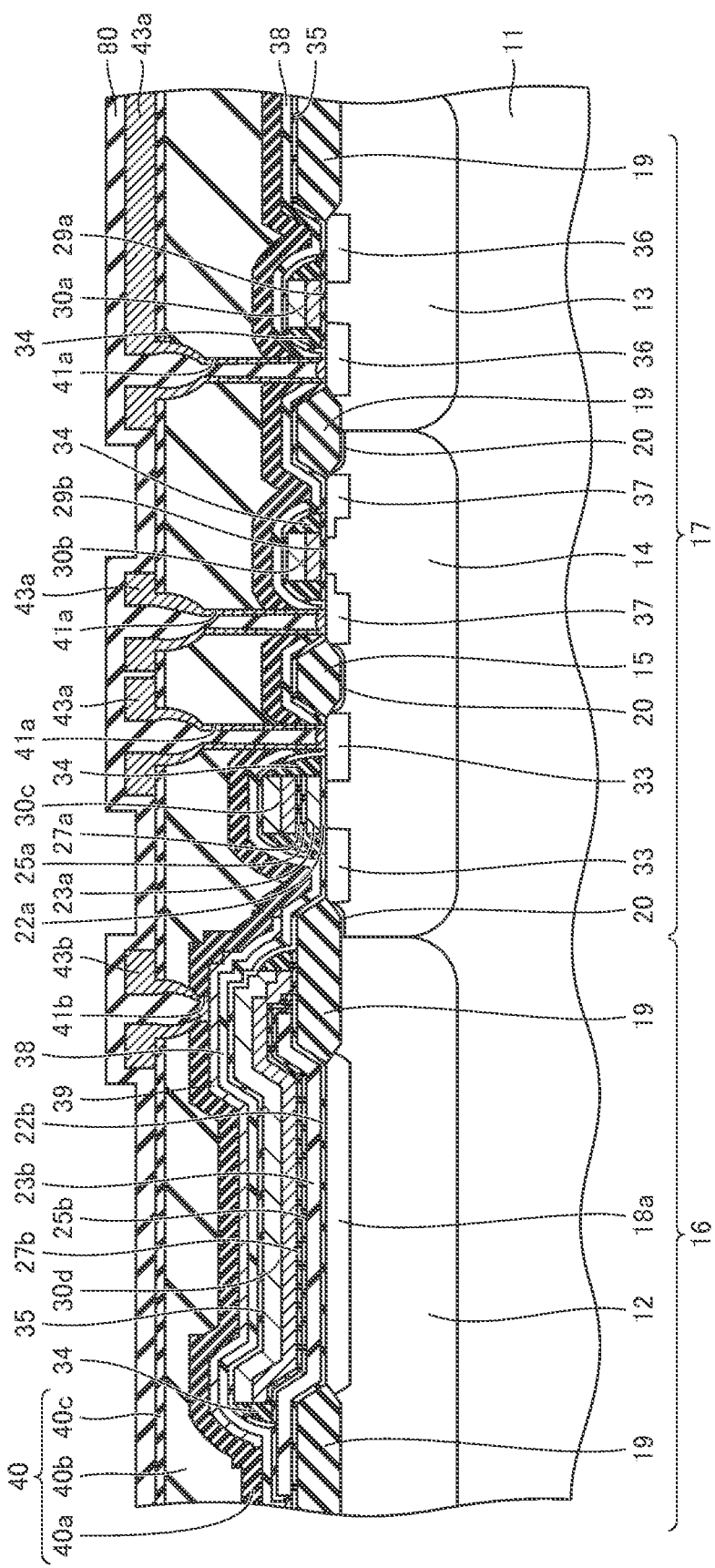
FIG. 32 is a sectional view representing a step in a fabrication method of a semiconductor pressure sensor according to a sixth embodiment of the present invention.

Subsequent to the steps similar to those shown in FIGS. 1-9, first interconnection 43a is formed at CMOS region 17 whereas interconnection 43b is formed at pressure sensor region 16 in the present embodiment, as shown in FIG. 32. For the first interconnection and the like, a stacked film including a barrier metal film and an aluminium silicon copper (AlSiCu) film is formed. For the barrier metal film, a titanium nitride (TiN) film is applied.

Alternatively for the first interconnection and the like, a tungsten plug may be formed at contact holes 41a, 41b, and then barrier metal and an aluminium copper (AlCu) film may be formed, followed by patterning. In this case, the barrier metal includes a titanium silicide ($TiSi_2$) or cobalt silicide ($CoSi_2$) film, or the like.

As shown in FIG. 32, a first segment film 80 is formed so as to cover first interconnection 43a and interconnection 43b, as the film formed first of the second interlayer insulation film. This first segment film 80 serves as a protection film to protect first interconnection 43a and interconnection 43b during the etching process for removing sacrifice film 23b, as will be described afterwards. Sacrifice film 23b is removed by wet etching applying TMAH, or by dry etching applying xenon difluoride (XeF$_4$) or the like. In this etching process, first segment film 80 having a thickness of approximately 50-300 nm is appropriate for protecting first interconnection 43a and interconnection 43b due to the great etching selectivity ratio with respect to the oxide film.

Figure 33:
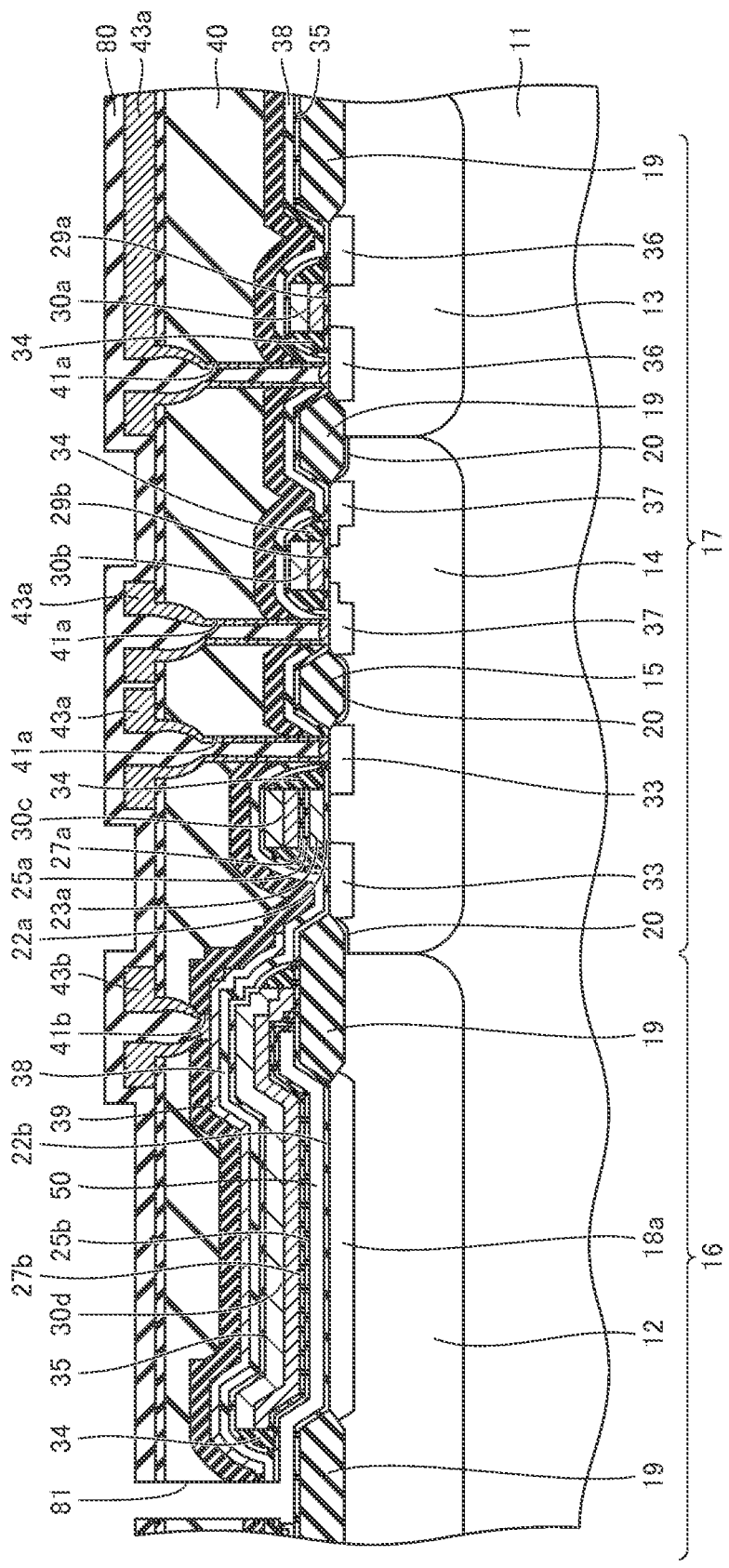
FIGS. 33-36 are sectional views representing a step performed after the step of a preceding drawing in the sixth embodiment.

Then, a resist mask (not shown) directed to forming an etching hole is provided by photolithography. By applying an etching process using that resist mask as an etching mask, etching hole 81 is formed for the purpose of etching the sacrifice film, as shown in FIG. 33. By applying a wet etching process through etching hole 81, sacrifice film 23b is removed. FIG. 33 corresponds to the step of this stage. For the chemical agent in the wet etching process, TMAH, for example, is used.

In the etching process of sacrifice film 23b (polysilicon film) with TMAH applied, the etching rate of sacrifice film 23b to the etching rate of first segment film 80 (etching selectivity ratio) is approximately 500-3000. The etching rate of first segment film 80 is low enough to the etching rate of sacrifice film 23b. Therefore, first interconnection 43a and interconnection 43b can be protected sufficiently by first segment film 80 having a thickness of approximately 50-300 nm.

Figure 34:
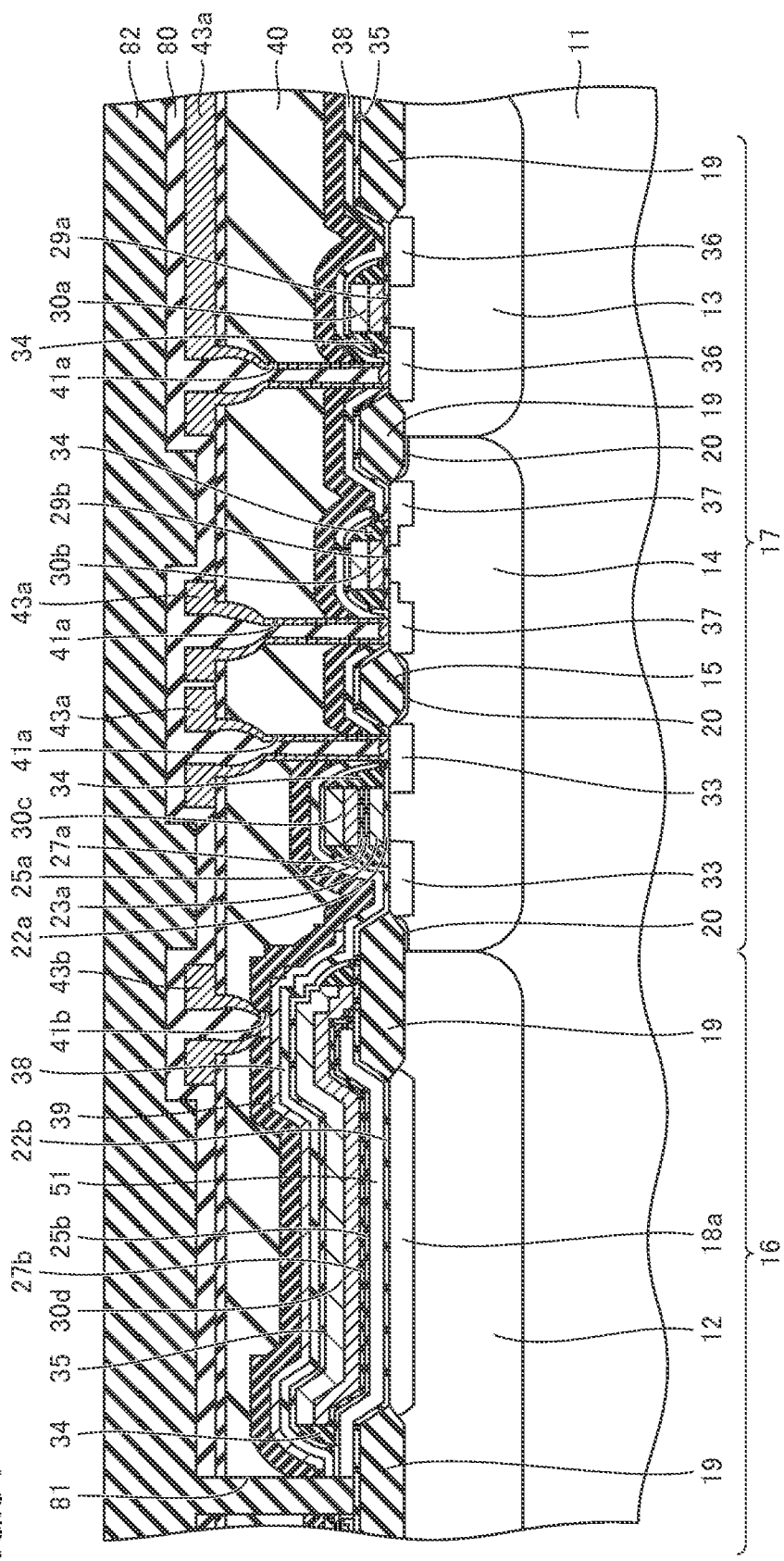

As a segment film formed at the second time for the second interlayer insulation film, a second segment film 82 is formed, as shown in FIG. 34. At this stage, the provision of second segment film 82 in vacuum causes void 50 to be reduced in pressure. Furthermore, the etching hole is closed by second segment film 82 to provide a vacuum chamber 51. The film thickness of second segment film 82 is approximately 500-1500 nm.

The sum of the film thickness of first segment film 80 and second segment film 82 is set to attain the film thickness of the second interlayer insulation film that is approximately 500-1500 nm, applied in the CMOS process. Accordingly, the CMOS standard process can be applied intentionally, allowing increase in the fabrication steps to be suppressed. Further, fabrication of a semiconductor pressure sensor is facilitated. Moreover, degradation in the property as a semiconductor pressure sensor can be prevented.

Figure 35:
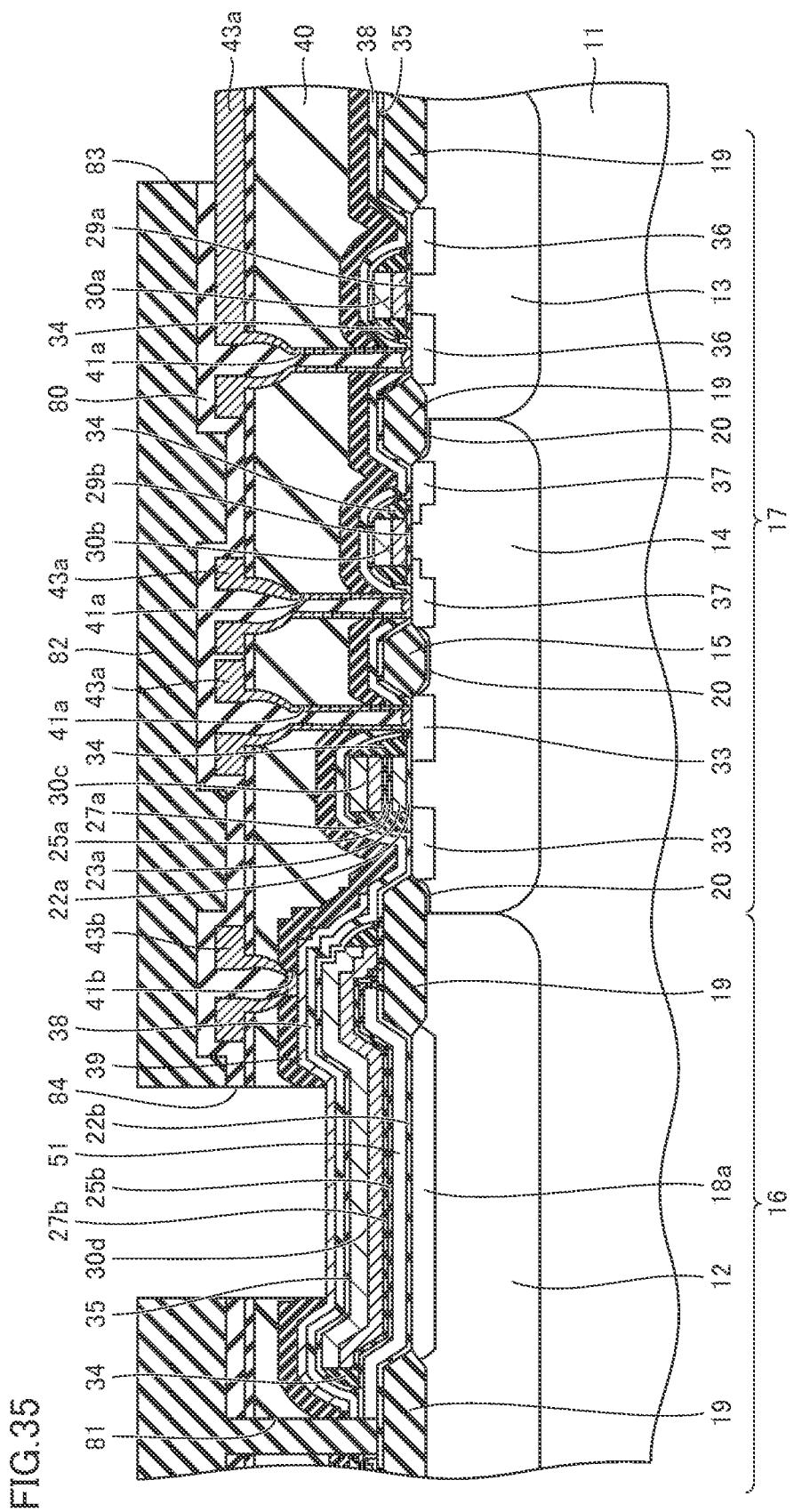

Next, a resist mask (not shown) directed to forming a predetermined opening is provided. Using that resist mask as an etching mask, a dry etching process or an etching process based on a combination of dry etching and wet etching is applied. Accordingly, as shown in FIG. 35, first and second segment films 80 and 82 corresponding to second interlayer insulation film 45 as well as first interlayer insulation film 40 are removed to form an opening 84 at pressure sensor region 16. At CMOS region 17, an opening 83 for a pad is formed. Then, the resist mask is removed.

Figure 36:
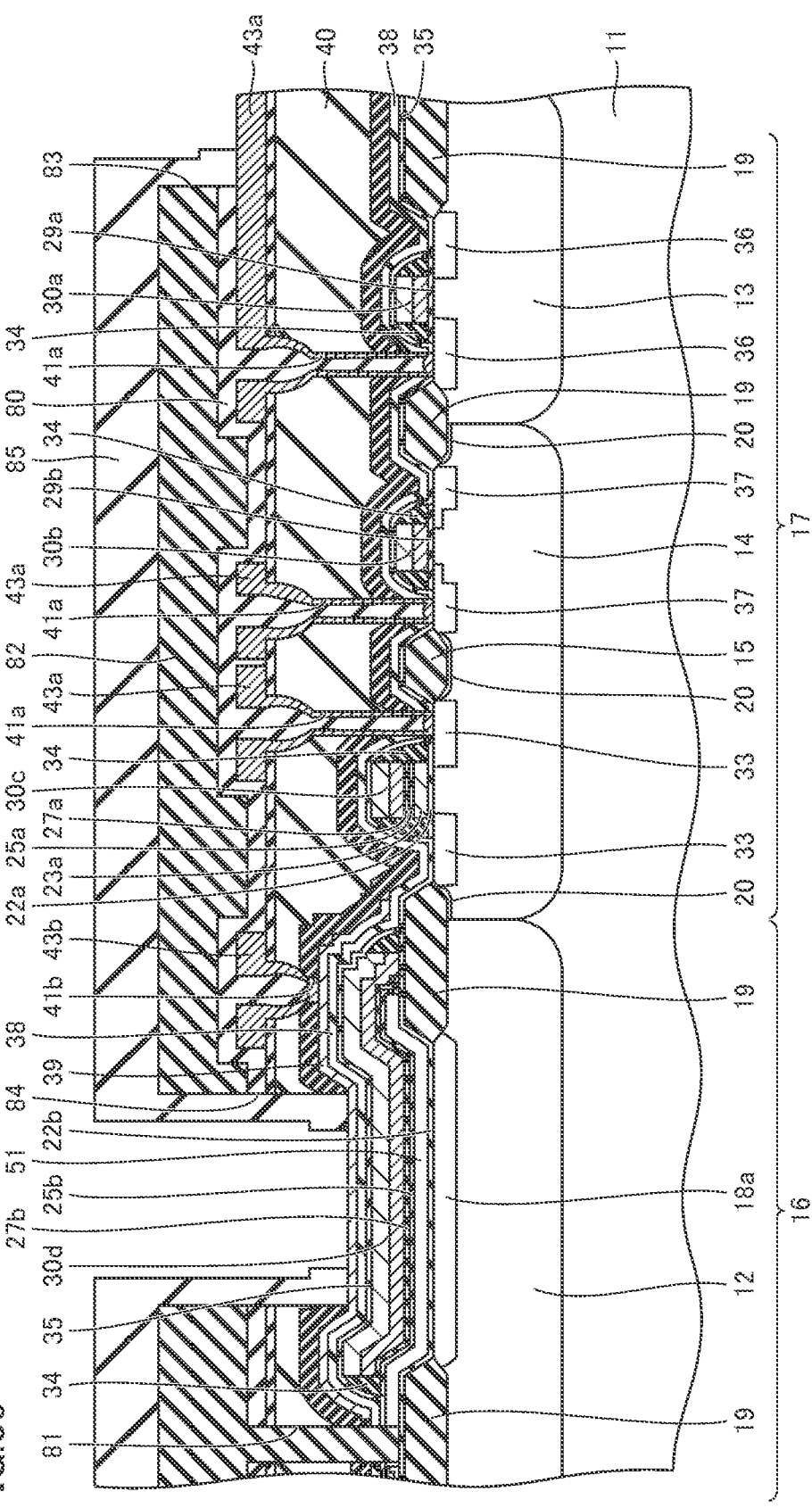

A silicon nitride film (not shown) qualified as a passivation film is formed so as to cover second segment film 82. By establishing a pattern on the silicon nitride film, passivation film 85 is provided, as shown in FIG. 36. By the patterning, the region of the silicon nitride film located immediately above movable electrode 30d is removed at pressure sensor region 16. At CMOS region 17, the region of the silicon nitride film located immediately above the pad is removed. Thus, the main part of the semiconductor pressure sensor is formed.

The present semiconductor pressure sensor is formed through fabrication steps similar to those described in the first embodiment, except for the formation of the second interlayer insulation film in a divided manner. Therefore, advantages substantially similar to those described in the first embodiment can be obtained in the sixth embodiment.

For the second interlayer insulation film, first segment film 80 functioning as a protection film and second segment film 82 functioning as a sealing film are formed. By forming first and second segment films 80 and 82 through the CMOS standard process, fabrication of a semiconductor pressure sensor can be facilitated. Furthermore, degradation in the property as a semiconductor pressure sensor can be prevented.

The present invention is effectively applicable to a semiconductor pressure sensor with a CMOS circuit including a transistor having a floating gate electrode (memory cell of an EPROM).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor pressure sensor comprising:
   a first region, a second region, and a third region defined at a surface of a semiconductor substrate;
   a pressure sensor formed at said first region, and including a fixed electrode, a void, and a movable electrode, said void located above said fixed electrode and said movable electrode located above said void;
   a memory cell transistor formed at said second region, and including a first electrode and a second electrode arranged above said first electrode as a gate electrode;
   a field effect transistor formed at said third region, and including a third electrode as another gate electrode;
   an interlayer insulation film formed so as to cover said pressure sensor, said memory cell transistor, and said field effect transistor;
   a hole formed at said interlayer insulation film, communicating with said void;
   a sealing portion sealing said void; and
   an opening formed at said interlayer insulation film, and open towards said pressure sensor, wherein said void formed by removing a portion from a film identical to a conductor film qualified as said first electrode,
   said movable electrode formed at the same time as, and of a film identical to, another conductor film qualified as said second electrode and said third electrode,
   said movable electrode has a thickness that is the same as a thickness of said second electrode and a thickness of said third electrode,
   said hole does not overlap said moveable electrode in plan view, and
   said hole does not pass through said moveable electrode.

2. The semiconductor pressure sensor according to claim 1, further comprising:
   a first protection film covering a top face of said fixed electrode;
   a second protection film covering a bottom face of said movable electrode;
   a first insulation film located between said first electrode and said semiconductor substrate, and qualified as a gate insulation film; and
   a second insulation film located between said first electrode and said second electrode, wherein said first protection film formed of a film identical to a film qualified as said first insulation film, and said second protection film formed of a film identical to a film qualified as said second insulation film.

3. The semiconductor pressure sensor according to claim 1, wherein said sealing portion includes a portion formed from any of aluminium (Al), aluminium silicon (Al—Si), aluminium silicon copper (Al—Si—Cu) and aluminium copper (Al—Cu).

4. The semiconductor pressure sensor according to claim 1, further comprising a third protection film formed so as to cover said movable electrode,
wherein said opening is formed to expose said third protection film.

5. The semiconductor pressure sensor according to claim 1, further comprising a sidewall film formed at a sidewall face of said movable electrode.

6. The semiconductor pressure sensor according to claim 1 wherein said fixed electrode includes an impurity diffusion region.

7. The semiconductor pressure sensor according to claim 1, wherein said fixed electrode includes a pair of impurity diffusion regions of a predetermined conductivity type, spaced apart from each other.

8. The semiconductor pressure sensor according to claim 1, further comprising:
an element isolation insulation film formed at said first region; and
a polysilicon film formed on said element isolation insulation film, wherein said fixed electrode includes said polysilicon film.

9. The semiconductor pressure sensor according to claim 1, further comprising a passivation film formed so as to cover said interlayer insulation film,
wherein said sealing portion includes a second portion formed of a film identical to a film qualified as said passivation film.

10. The semiconductor pressure sensor according to claim 1, further comprising an interconnection formed in contact with said interlayer insulation film, and electrically connected to said memory cell transistor or said field effect transistor,
wherein said sealing portion includes a first portion formed of a film identical to a film qualified as said interconnection.

11. The semiconductor pressure sensor according to claim 1, wherein
said interlayer insulation film comprises a lower insulation film, and an upper insulation film formed so as to cover said lower insulation film, and
said sealing portion is formed of said upper insulation film.

12. The semiconductor pressure sensor according to claim 1, wherein said pressure sensor comprises:
a first pressure sensor including a first fixed electrode as said fixed electrode, a first void as said void, and a first movable electrode as said movable electrode; and
a second pressure sensor including a second fixed electrode as said fixed electrode, a second void as said void, and a second movable electrode as said movable electrode, wherein
said opening formed at a region of said interlayer insulation film located above said first pressure sensor, and said second pressure sensor set at a state covered with said interlayer insulation film.

\* \* \* \* \*